(12) United States Patent
Choi et al.

(10) Patent No.: US 9,224,591 B2
(45) Date of Patent: Dec. 29, 2015

(54) METHOD OF DEPOSITING A THIN FILM

(71) Applicant: SAMSUNG DISPLAY CO., LTD., Yongin-si, Gyeonggi-do (KR)

(72) Inventors: Yong-Sup Choi, Yongin-si (KR); Kang-Il Lee, Yongin-si (KR); Chang Mog Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/054,536

(22) Filed: Oct. 15, 2013

(65) Prior Publication Data

US 2014/0045343 A1 Feb. 13, 2014

Related U.S. Application Data

(62) Division of application No. 12/907,396, filed on Oct. 19, 2010, now Pat. No. 8,876,975.

(30) Foreign Application Priority Data

Oct. 19, 2009 (KR) .......................... 10-2009-0099314
Feb. 17, 2010 (KR) .......................... 10-2010-0014277

(51) Int. Cl.
*C23C 16/455* (2006.01)
*H01L 21/02* (2006.01)
(Continued)

(52) U.S. Cl.
CPC .......... *H01L 21/02107* (2013.01); *C23C 14/04* (2013.01); *C23C 14/044* (2013.01);
(Continued)

(58) Field of Classification Search
CPC .......................... C23C 16/455; C23C 16/45563
USPC .......................................... 427/248.1, 255.5
See application file for complete search history.

(56) References Cited

U.S. PATENT DOCUMENTS 4,416,217 A 11/1983 Nakamura et al.
4,468,648 A 8/1984 Uchikune
(Continued)

FOREIGN PATENT DOCUMENTS

CN 1476279 A 2/2004
CN 1489419 A 4/2004
(Continued)

OTHER PUBLICATIONS

Arnold, Michael S., et al., "Direct vapor jet printing of three color segment organic light emitting devices for white light illumination". Applied Physics Letters 92, 055301 (2008), pp. 1-3.*
(Continued)

*Primary Examiner* — Bret Chen
(74) *Attorney, Agent, or Firm* — Christie, Parker & Hale, LLP

(57) ABSTRACT

A method of forming a thin film on a substrate includes arranging the substrate to face a thin film deposition apparatus; and discharging a deposition material via a deposition source of the thin film deposition apparatus onto the substrate; wherein a deposition source nozzle unit of the thin film deposition apparatus is disposed at a side of the deposition source and includes a plurality of deposition source nozzles arranged in a first direction; wherein a patterning slit sheet of the thin film deposition apparatus is disposed to be between the deposition source nozzle unit and the substrate, the patterning slit sheet including a plurality of patterning slits, and wherein each of the patterning slits includes a plurality of sub-slits.

16 Claims, 13 Drawing Sheets

(51) Int. Cl.

| | | |
|---|---|---|
| *C23C 16/448* | (2006.01) | |
| *C23C 16/04* | (2006.01) | |
| *C23C 14/24* | (2006.01) | |
| *C23C 14/04* | (2006.01) | |
| *C23C 14/12* | (2006.01) | |
| *C23C 14/56* | (2006.01) | |

(52) U.S. Cl.
CPC ............... *C23C 14/12* (2013.01); *C23C 14/24* (2013.01); *C23C 14/243* (2013.01); *C23C 14/564* (2013.01); *C23C 16/04* (2013.01); *C23C 16/042* (2013.01); *C23C 16/4485* (2013.01); *C23C 16/448* (2013.01); *C23C 16/45563* (2013.01)

(56) References Cited

U.S. PATENT DOCUMENTS

| | | | |
|---|---|---|---|
| 4,687,939 | A | 8/1987 | Miyauchi et al. |
| 4,901,667 | A | 2/1990 | Suzuki et al. |
| 5,454,847 | A | 10/1995 | Jacoboni et al. |
| 5,460,654 | A | 10/1995 | Kikkawa et al. |
| 5,487,609 | A | 1/1996 | Asada |
| 5,742,129 | A | 4/1998 | Nagayama et al. |
| 5,909,995 | A | 6/1999 | Wolf et al. |
| 6,045,671 | A | 4/2000 | Wu et al. |
| 6,091,195 | A | 7/2000 | Forrest et al. |
| 6,099,649 | A | 8/2000 | Schmitt et al. |
| 6,255,775 | B1 | 7/2001 | Ikuko et al. |
| 6,274,198 | B1 | 8/2001 | Dautartas |
| 6,280,821 | B1 | 8/2001 | Kadunce et al. |
| 6,371,451 | B1 | 4/2002 | Choi |
| 6,417,034 | B2 | 7/2002 | Kitazume et al. |
| 6,443,597 | B1 | 9/2002 | Natori |
| 6,483,690 | B1 | 11/2002 | Nakajima et al. |
| 6,541,130 | B2 | 4/2003 | Fukuda |
| 6,554,969 | B1 | 4/2003 | Chong |
| 6,579,422 | B1 | 6/2003 | Kakinuma |
| 6,589,673 | B1 | 7/2003 | Kido et al. |
| 6,650,023 | B2 | 11/2003 | Kim |
| 6,699,324 | B1 | 3/2004 | Berdin et al. |
| 6,749,906 | B2 | 6/2004 | Van Slyke |
| 6,776,847 | B2 | 8/2004 | Yamazaki et al. |
| 6,837,939 | B1 | 1/2005 | Klug et al. |
| 6,878,209 | B2 | 4/2005 | Himeshima et al. |
| 6,946,783 | B2 | 9/2005 | Kim |
| 6,995,035 | B2 | 2/2006 | Cok et al. |
| 7,006,202 | B2 | 2/2006 | Byun et al. |
| RE39,024 | E | 3/2006 | Takahashi |
| 7,015,154 | B2 | 3/2006 | Yamazaki et al. |
| 7,078,070 | B2 | 7/2006 | Peng |
| 7,199,520 | B2 | 4/2007 | Fujii et al. |
| 7,282,855 | B2 | 10/2007 | Park et al. |
| 7,322,248 | B1 | 1/2008 | Long |
| 7,495,389 | B2 | 2/2009 | Noguchi et al. |
| 7,601,439 | B2 | 10/2009 | Chun et al. |
| 7,776,457 | B2 | 8/2010 | Lee et al. |
| 7,833,354 | B2 | 11/2010 | Kim et al. |
| 7,872,256 | B2 | 1/2011 | Sung et al. |
| 7,910,386 | B2 | 3/2011 | Shiang et al. |
| 7,964,037 | B2 | 6/2011 | Fukuda et al. |
| 8,022,448 | B1 | 9/2011 | Luu et al. |
| 8,128,753 | B2 | 3/2012 | Bulovic et al. |
| 8,137,466 | B2 * | 3/2012 | Kang et al. .................... 118/719 |
| 8,188,476 | B2 | 5/2012 | Takagi et al. |
| 8,193,011 | B2 | 6/2012 | Kang et al. |
| 8,461,058 | B2 | 6/2013 | Prushinskiy et al. |
| 8,486,737 | B2 | 7/2013 | Lee et al. |
| 8,536,057 | B2 | 9/2013 | Lee et al. |
| 8,673,077 | B2 | 3/2014 | Sonoda et al. |
| 2001/0004186 | A1 | 6/2001 | Song et al. |
| 2001/0006827 | A1 | 7/2001 | Yamazaki et al. |
| 2001/0019807 | A1 | 9/2001 | Yamada et al. |
| 2001/0026638 | A1 | 10/2001 | Sangu et al. |
| 2001/0034175 | A1 | 10/2001 | Miyazaki et al. |
| 2002/0011785 | A1 | 1/2002 | Tang et al. |
| 2002/0017245 | A1 | 2/2002 | Tsubaki et al. |
| 2002/0033136 | A1 | 3/2002 | Savage et al. |
| 2002/0036759 | A1 | 3/2002 | Ise et al. |
| 2002/0050061 | A1 | 5/2002 | Komyoji et al. |
| 2002/0076847 | A1 | 6/2002 | Yamada et al. |
| 2002/0168577 | A1 | 11/2002 | Yoon |
| 2002/0179013 | A1 | 12/2002 | Kido et al. |
| 2002/0187253 | A1 | 12/2002 | Marcus et al. |
| 2002/0194727 | A1 | 12/2002 | Cho et al. |
| 2002/0197393 | A1* | 12/2002 | Kuwabara ........................ 427/66 |
| 2003/0021886 | A1 | 1/2003 | Baele |
| 2003/0101932 | A1 | 6/2003 | Kang |
| 2003/0101937 | A1 | 6/2003 | Van Slyke et al. |
| 2003/0117602 | A1 | 6/2003 | Kobayashi et al. |
| 2003/0118950 | A1 | 6/2003 | Chao et al. |
| 2003/0124764 | A1 | 7/2003 | Yamazaki et al. |
| 2003/0140858 | A1 | 7/2003 | Marcus et al. |
| 2003/0151637 | A1 | 8/2003 | Nakamura et al. |
| 2003/0164934 | A1 | 9/2003 | Nishi et al. |
| 2003/0168013 | A1 | 9/2003 | Freeman et al. |
| 2003/0173896 | A1 | 9/2003 | Grushin et al. |
| 2003/0221614 | A1 | 12/2003 | Kang et al. |
| 2003/0221620 | A1 | 12/2003 | Yamazaki |
| 2003/0232563 | A1 | 12/2003 | Kamiyama et al. |
| 2004/0016907 | A1 | 1/2004 | Shi |
| 2004/0029028 | A1 | 2/2004 | Shimizu |
| 2004/0056244 | A1 | 3/2004 | Marcus et al. |
| 2004/0086639 | A1 | 5/2004 | Grantham et al. |
| 2004/0096771 | A1* | 5/2004 | Kashiwagi et al. ........... 430/192 |
| 2004/0115338 | A1* | 6/2004 | Yoneda ........................ 427/66 |
| 2004/0115342 | A1 | 6/2004 | Shigemura |
| 2004/0123804 | A1 | 7/2004 | Yamazaki et al. |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0157167 | A1 | 8/2004 | Morii |
| 2004/0183435 | A1 | 9/2004 | Oshita |
| 2004/0194702 | A1 | 10/2004 | Sasaki et al. |
| 2004/0195530 | A1 | 10/2004 | Kwak et al. |
| 2004/0216673 | A1 | 11/2004 | Sakata et al. |
| 2004/0255857 | A1 | 12/2004 | Chow et al. |
| 2004/0263547 | A1 | 12/2004 | Sugahara |
| 2004/0263771 | A1 | 12/2004 | Jeong et al. |
| 2005/0001546 | A1 | 1/2005 | Yamaguchi |
| 2005/0016461 | A1 | 1/2005 | Klug et al. |
| 2005/0031836 | A1 | 2/2005 | Hira |
| 2005/0037136 | A1 | 2/2005 | Yamamoto |
| 2005/0039684 | A1 | 2/2005 | Yi et al. |
| 2005/0072359 | A1 | 4/2005 | Kim |
| 2005/0072361 | A1 | 4/2005 | Yang et al. |
| 2005/0079418 | A1 | 4/2005 | Kelley et al. |
| 2005/0110400 | A1 | 5/2005 | Nakamura |
| 2005/0118788 | A1 | 6/2005 | Kuwahara et al. |
| 2005/0129489 | A1 | 6/2005 | Quan et al. |
| 2005/0153472 | A1 | 7/2005 | Yotsuya |
| 2005/0166842 | A1 | 8/2005 | Sakamoto |
| 2005/0166844 | A1 | 8/2005 | Gralenski |
| 2005/0183670 | A1 | 8/2005 | Grantham et al. |
| 2005/0186330 | A1 | 8/2005 | Kim et al. |
| 2005/0208697 | A1 | 9/2005 | Seo et al. |
| 2005/0213021 | A1 | 9/2005 | Myoung |
| 2005/0217584 | A1 | 10/2005 | Abiko et al. |
| 2005/0229848 | A1 | 10/2005 | Shinriki et al. |
| 2005/0244580 | A1 | 11/2005 | Cok et al. |
| 2005/0263074 | A1 | 12/2005 | Masuda et al. |
| 2006/0011136 | A1 | 1/2006 | Yamazaki et al. |
| 2006/0012771 | A1 | 1/2006 | Jeong |
| 2006/0022590 | A1 | 2/2006 | Aziz et al. |
| 2006/0040132 | A1 | 2/2006 | Liao et al. |
| 2006/0045958 | A1* | 3/2006 | Abiko et al. ..................... 427/66 |
| 2006/0066231 | A1 | 3/2006 | Nishikawa et al. |
| 2006/0090705 | A1 | 5/2006 | Kim |
| 2006/0102078 | A1 | 5/2006 | Fairbairn et al. |
| 2006/0110544 | A1 | 5/2006 | Kim et al. |
| 2006/0113907 | A1 | 6/2006 | Im et al. |
| 2006/0115585 | A1 | 6/2006 | Bulovic et al. |
| 2006/0130766 | A1 | 6/2006 | Kim et al. |

(56) References Cited

U.S. PATENT DOCUMENTS

| | | |
|---|---|---|
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0154640 A1* | 7/2007 | Lee ................. 427/282 |
| 2007/0157879 A1 | 7/2007 | Yotsuya |
| 2007/0158471 A1* | 7/2007 | Park et al. ......... 239/451 |
| 2007/0163497 A1 | 7/2007 | Grace et al. |
| 2007/0178708 A1* | 8/2007 | Ukigaya ............ 438/758 |
| 2007/0190235 A1 | 8/2007 | Yamazaki et al. |
| 2007/0195844 A1 | 8/2007 | Ma et al. |
| 2007/0212896 A1 | 9/2007 | Olsen et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100201 A1 | 5/2008 | Wei et al. |
| 2008/0100204 A1 | 5/2008 | Kim |
| 2008/0115729 A1 | 5/2008 | Oda et al. |
| 2008/0116166 A1* | 5/2008 | Tu et al. ............ 216/13 |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0268171 A1* | 10/2008 | Ma et al. ........... 427/569 |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1* | 12/2008 | Oya et al. .......... 347/47 |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0307409 A1 | 12/2010 | Lee et al. |
| 2010/0310759 A1 | 12/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0033964 A1 | 2/2011 | Oh et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0053301 A1 | 3/2011 | Kang et al. |
| 2011/0123707 A1 | 5/2011 | Lee et al. |
| 2011/0139069 A1 | 6/2011 | Ahn et al. |
| 2011/0165320 A1 | 7/2011 | Choi et al. |
| 2011/0165327 A1 | 7/2011 | Park et al. |
| 2011/0168986 A1 | 7/2011 | Lee et al. |
| 2011/0186820 A1 | 8/2011 | Kim et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0244120 A1 | 10/2011 | Choi et al. |
| 2011/0262625 A1* | 10/2011 | Park et al. ......... 427/66 |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009333 A1* | 1/2012 | Choi et al. ......... 438/34 |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1* | 4/2012 | Kang et al. ........ 438/46 |
| 2012/0097992 A1 | 4/2012 | Jeong |
| 2012/0100282 A1 | 4/2012 | Lee et al. |
| 2012/0100644 A1* | 4/2012 | Prushinskiy et al. ...... 438/22 |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0298970 A1 | 11/2012 | Lee et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |

(56) References Cited

U.S. PATENT DOCUMENTS

| | | | |
|---|---|---|---|
| 2013/0157016 A1 | 6/2013 | Kim | |
| 2013/0217164 A1 | 8/2013 | Kang et al. | |
| 2013/0291796 A1 | 11/2013 | Inoue et al. | |
| 2013/0298829 A1 | 11/2013 | Jo et al. | |
| 2013/0323881 A1 | 12/2013 | Sonoda et al. | |
| 2013/0341598 A1 | 12/2013 | Chang et al. | |
| 2014/0010957 A1 | 1/2014 | Inoue et al. | |
| 2014/0014917 A1 | 1/2014 | Lee et al. | |
| 2014/0014918 A1 | 1/2014 | Han | |
| 2014/0014920 A1 | 1/2014 | Lee | |
| 2014/0014921 A1 | 1/2014 | Choi | |
| 2014/0014924 A1 | 1/2014 | Oh et al. | |
| 2014/0014929 A1 | 1/2014 | Lee et al. | |
| 2014/0034917 A1 | 2/2014 | Lee et al. | |
| 2014/0045343 A1 | 2/2014 | Choi et al. | |
| 2014/0077168 A1 | 3/2014 | Kim | |
| 2014/0084262 A1 | 3/2014 | Kim | |
| 2014/0084263 A1 | 3/2014 | Jin et al. | |
| 2014/0110680 A1 | 4/2014 | Choe | |
| 2014/0131667 A1 | 5/2014 | Chang | |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 | 11/1982 |
| JP | 2-247372 | 10/1990 |
| JP | 04-272170 A | 9/1992 |
| JP | 5-22405 U1 | 3/1993 |
| JP | 5-98425 A2 | 4/1993 |
| JP | 05-230628 | 9/1993 |
| JP | 08-027568 | 1/1996 |
| JP | 09-095776 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-068054 A | 3/2000 |
| JP | 2000-282219 | 10/2000 |
| JP | 2000-323277 | 11/2000 |
| JP | 2001-28325 A2 | 1/2001 |
| JP | 2001-052862 A | 2/2001 |
| JP | 2001-093667 A | 4/2001 |
| JP | 2002-004045 | 1/2002 |
| JP | 2002-075638 A | 3/2002 |
| JP | 2002-175878 A | 6/2002 |
| JP | 2002-348659 A2 | 12/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2003-197531 | 11/2003 |
| JP | 2003-321767 A | 11/2003 |
| JP | 2003-347394 A2 | 12/2003 |
| JP | 2004-035964 | 2/2004 |
| JP | 2004-043898 A | 2/2004 |
| JP | 2004-076150 | 3/2004 |
| JP | 2004-91858 A2 | 3/2004 |
| JP | 2004-103269 A | 4/2004 |
| JP | 2004-103341 A | 4/2004 |
| JP | 2004-107764 A2 | 4/2004 |
| JP | 2004-137583 | 5/2004 |
| JP | 2004-143521 A2 | 5/2004 |
| JP | 2004-169169 A | 6/2004 |
| JP | 2004-199919 A | 7/2004 |
| JP | 2004-225058 | 8/2004 |
| JP | 2004-342455 A2 | 12/2004 |
| JP | 2004-349101 A | 12/2004 |
| JP | 2004-355975 | 12/2004 |
| JP | 2005-044592 A | 2/2005 |
| JP | 2005-101505 | 4/2005 |
| JP | 2005-122980 A | 5/2005 |
| JP | 2005-163099 | 6/2005 |
| JP | 2005-165015 | 6/2005 |
| JP | 2005-174843 A | 6/2005 |
| JP | 2005-206939 | 8/2005 |
| JP | 2005-213616 A2 | 8/2005 |
| JP | 2005-235568 A | 9/2005 |
| JP | 2005-293968 A | 10/2005 |
| JP | 2005-296737 A | 10/2005 |
| JP | 2006-028583 | 2/2006 |
| JP | 2006-172930 | 6/2006 |
| JP | 2006-176809 | 7/2006 |
| JP | 2006-210038 A | 8/2006 |
| JP | 2006-219760 | 8/2006 |
| JP | 2006-275433 A | 10/2006 |
| JP | 2006-292955 | 10/2006 |
| JP | 2006-307247 A2 | 11/2006 |
| JP | 2007-047293 A | 2/2007 |
| JP | 2007-66862 | 3/2007 |
| JP | 2007-146219 | 6/2007 |
| JP | 2007-157886 | 6/2007 |
| JP | 2007-186740 A | 7/2007 |
| JP | 2007-242436 | 9/2007 |
| JP | 2007-291506 | 11/2007 |
| JP | 2008-19477 A2 | 1/2008 |
| JP | 2008-108628 A | 5/2008 |
| JP | 2008-121098 A | 5/2008 |
| JP | 2008-521165 A | 6/2008 |
| JP | 2008-156686 | 7/2008 |
| JP | 2008-196002 | 8/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 A | 1/2009 |
| JP | 2009-024208 | 2/2009 |
| JP | 2009-049223 | 3/2009 |
| JP | 2009-081165 | 4/2009 |
| JP | 2009-87910 A | 4/2009 |
| JP | 2009-117231 A2 | 5/2009 |
| JP | 2010-159167 A2 | 7/2010 |
| JP | 2010-261081 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 A | 4/2000 |
| KR | 10-2000-0023929 A | 5/2000 |
| KR | 10-2001-0024652 A | 3/2001 |
| KR | 2001-0030175 A | 4/2001 |
| KR | 10-2001-0039298 A | 5/2001 |
| KR | 10-2001-0059939 A | 7/2001 |
| KR | 10-2001-0092914 | 10/2001 |
| KR | 10-2001-0093666 | 10/2001 |
| KR | 20-0257218 Y1 | 11/2001 |
| KR | 10-2002-0000201 A | 1/2002 |
| KR | 10-2002-0001555 A | 1/2002 |
| KR | 2002-0025760 | 4/2002 |
| KR | 10-2002-0050922 A | 6/2002 |
| KR | 2002-0088662 A | 11/2002 |
| KR | 10-2002-0090934 A | 12/2002 |
| KR | 10-2002-0091457 A | 12/2002 |
| KR | 10-2003-0001745 | 1/2003 |
| KR | 10-2003-0034730 | 5/2003 |
| KR | 10-2003-0043012 A | 6/2003 |
| KR | 10-2003-0046090 A | 6/2003 |
| KR | 2003-0069684 A | 8/2003 |
| KR | 10-0405080 B1 | 11/2003 |
| KR | 10-0406059 B1 | 11/2003 |
| KR | 10-2003-0091947 A | 12/2003 |
| KR | 10-2003-0093959 A | 12/2003 |

(56) References Cited

FOREIGN PATENT DOCUMENTS

| | | |
|---|---|---|
| KR | 10-2003-0094033 | 12/2003 |
| KR | 10-2004-0014258 | 2/2004 |
| KR | 20-0342433 Y1 | 2/2004 |
| KR | 10-2004-0034537 A | 4/2004 |
| KR | 10-2004-0039910 A | 5/2004 |
| KR | 10-0430336 B1 | 5/2004 |
| KR | 10-2004-0050045 A | 6/2004 |
| KR | 10-2004-0069281 A | 8/2004 |
| KR | 10-2004-0084747 A | 10/2004 |
| KR | 10-2004-0087142 | 10/2004 |
| KR | 10-2004-0110718 A | 12/2004 |
| KR | 10-0463212 B1 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-2005-0062853 A | 6/2005 |
| KR | 10-2005-0082644 A | 8/2005 |
| KR | 10-0520159 B1 | 10/2005 |
| KR | 10-0532657 B1 | 12/2005 |
| KR | 10-2006-0008602 A | 1/2006 |
| KR | 10-2006-0018745 A | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0081943 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-2006-0104288 | 10/2006 |
| KR | 10-2006-0104675 A | 10/2006 |
| KR | 10-2006-0104677 A | 10/2006 |
| KR | 10-2006-0109561 A | 10/2006 |
| KR | 10-2006-0109627 A | 10/2006 |
| KR | 10-0635903 B1 | 10/2006 |
| KR | 10-2006-0114462 | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 B1 | 11/2006 |
| KR | 10-2006-0123944 | 12/2006 |
| KR | 10-0687007 B1 | 2/2007 |
| KR | 10-2007-0025164 A | 3/2007 |
| KR | 10-0696547 B1 | 3/2007 |
| KR | 10-0696550 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-2007-0037848 A | 4/2007 |
| KR | 10-0711885 B1 | 4/2007 |
| KR | 10-2007-0050793 A | 5/2007 |
| KR | 10-2007-0056190 A | 6/2007 |
| KR | 10-0723627 B1 | 6/2007 |
| KR | 10-0726132 B1 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 A | 10/2007 |
| KR | 10-2007-0105595 A | 10/2007 |
| KR | 10-0768212 | 10/2007 |
| KR | 10-0770653 B1 | 10/2007 |
| KR | 10-2007-0112668 A | 11/2007 |
| KR | 10-2007-0114094 A | 11/2007 |
| KR | 10-0787457 B1 | 12/2007 |
| KR | 10-2008-0001184 A | 1/2008 |
| KR | 10-2008-0003720 | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 B1 | 6/2008 |
| KR | 10-2008-0055124 | 6/2008 |
| KR | 10-2008-0057159 A | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0061666 | 7/2008 |
| KR | 10-2008-0061774 | 7/2008 |
| KR | 10-2008-0062212 A | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 A | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-2009-0053417 A | 5/2009 |
| KR | 10-0899279 B1 | 5/2009 |
| KR | 10-2009-0066996 | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 A | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 A | 5/2010 |
| KR | 10-0961110 B1 | 6/2010 |
| KR | 10-2010-0090070 A | 8/2010 |
| KR | 10-2010-0099806 | 9/2010 |
| KR | 10-2010-0119368 A | 11/2010 |
| KR | 10-2010-0126125 | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-010767 A | 9/2011 |
| KR | 10-2011-0110525 A | 10/2011 |

(56) References Cited

FOREIGN PATENT DOCUMENTS

| | | | |
|---|---|---|---|
| KR | 10-2011-0120213 A | 11/2011 | |
| KR | 10-2011-0138787 A | 12/2011 | |
| KR | 10-2012-0006322 A | 1/2012 | |
| KR | 10-2012-0006324 | 1/2012 | |
| KR | 10-2012-0012300 | 2/2012 | |
| KR | 10-2012-0042155 A | 5/2012 | |
| KR | 10-2012-0065789 A | 6/2012 | |
| KR | 10-2012-0080855 A | 7/2012 | |
| KR | 10-2012-0081811 A | 7/2012 | |
| KR | 10-1193186 B1 | 10/2012 | |
| KR | 10-2012-0131545 A | 12/2012 | |
| KR | 10-2013-0007308 A | 1/2013 | |
| WO | WO 99/25894 | 5/1999 | |
| WO | 03043067 A1 | 5/2003 | |
| WO | WO2004016406 A1 | 2/2004 | |
| WO | WO 2008/004792 A1 | 1/2008 | |

OTHER PUBLICATIONS

Yang, Yang, et al., "Organic/polymeric electroluminescent devices processed by hybrid ink-jet printing". Journal or Materials Science: Materials in Electronics 11 (2000) 89-96.*

English machine translation of Japanese Publication 2004-349101 (10 pages).

Japanese Office Action, dated Aug. 21, 2012, corresponding to JP 2010-145075 (5 pages).

Japanese Office Action, dated Sep. 4, 2012, corresponding to JP 2010-152846 (4 pages).

KIPO Notice of Allowance dated Aug. 24, 2012 for Korean Patent application 10-2010-0066993, (5 pages).

KIPO Notice of Allowance dated Oct. 31, 2011 for Korean Patent application 10-2010-0014273, (5 pages).

KIPO Notice of Allowance dated Sep. 1, 2012 for Korean Patent application 10-2010-0014276, (5 pages).

KIPO Office action dated Apr. 2, 2012 for Korean Patent application 10-2010-0066993, (4 pages).

KIPO Office action dated Aug. 1, 2011 for Korean Patent application 10-2009-0074001, (3 pages).

KIPO Office action dated Aug. 28, 2012 for Korean Patent application 10-2010-0014274, (5 pages).

KIPO Office action dated Feb. 1, 2012 for Korean Patent application 10-2010-0014272, (4 pages).

KIPO Office action dated Feb. 6, 2012 for Korean Patent application 10-2010-0021835, (4 pages).

KIPO Office action dated Feb. 6, 2012 for Korean Patent application 10-2010-0014274, (9 pages).

KIPO Registration Determination Certificate dated Jan. 13, 2012, for Korean Patent application 10-2009-0056529 (5 pages).

KIPO Registration Determination Certificate dated Apr. 30, 2012, for Korean Patent application 10-2010-0066992 (5 pages).

KIPO Registration Determination Certificate dated Jul. 20, 2012, for Korean Patent application 10-2010-0003545 (5 pages).

KIPO Registration Determination Certificate dated Sep. 28, 2012, for Korean Patent application 10-2009-0052357 (5 pages).

KIPO Registration Determination Certificate dated Nov. 25, 2012, for Korean Patent application 10-2010-0014277 (5 pages).

Korean Office Action dated Feb. 1, 2012, corresponding to KR 10-2010-0011196 (4 pages).

Korean Office Action dated Feb. 1, 2012, corresponding to KR 10-2010-0013848 (4 pages).

Korean Office Action dated Sep. 1, 2012, corresponding to KR 10-2010-0010136 (5 pages).

Korean Office Notice of Allowance, dated Sep. 1, 2012, corresponding to KR 10-2010-0013848 (5 pages).

Korean Office Notice of Allowance, dated Sep. 1, 2012, corresponding to KR 10-2010-0009160 (5 pages).

Korean Patent Abstract, Publication No. 10-2001-0062735 A, dated Jul. 7, 2001 for corresponding Korean Patent 10-0827760 listed above.

Korean Patent Abstract, Publication No. 10-2002-0034272 A, dated May 9, 2002 for corresponding Korean Patent 10-0726132 listed above.

Korean Patent Abstract, Publication No. 10-2002-0056238 A, dated Jul. 10, 2002 for corresponding Korean Patent 10-0698033 listed above.

Korean Patent Abstract, Publication No. 10-2002-0086047 A, dated Nov. 18, 2002 for corresponding Korean Patent 10-0405080 listed above.

Korean Patent Abstract, Publication No. 10-2002-0088662 A, dated Nov. 29, 2002 for corresponding Korean Patent 10-0463212 listed above.

Korean Patent Abstract, Publication No. 10-2004-0062203 A, dated Jul. 7, 2004 for corresponding Korean Patent 10-0646160 listed above.

Korean Patent Abstract, Publication No. 10-2005-0045619 A, dated May 17, 2005 for corresponding Korean Patent 10-0520159 listed above.

Korean Patent Abstract, Publication No. 10-2005-0078637 A, dated Aug. 5, 2005 for corresponding Korean Patent 10-0700466 listed above.

Korean Patent Abstract, Publication No. 10-2006-0101987 A, dated Sep. 27, 2006 for corresponding Korean Patent 10-0687007 listed above.

Korean Patent Abstract, Publication No. 10-2006-0126267 A, dated Dec. 7, 2006 for corresponding Korean Patent 10-0797787 listed above.

Korean Patent Abstract, Publication No. 10-2007-0025164 A, dated Mar. 8, 2007 for corresponding Korean Patent 10-0711885 listed above.

Korean Patent Abstract, Publication No. 10-2007-0050793, dated May 16, 2007 for corresponding Korean Patent 10-0815265 listed above, Dec. 3, 2013.

Korean Patent Abstract, Publication No. 10-2008-0038650, dated Jul. 5, 2008 for corresponding Korean Patent 10-0839380 listed above.

Korean Patent Abstract, Publication No. 2008-0002189 A, dated Jan. 4, 2008 for corresponding Korean Patent 10-0800125 listed above.

Korean Patent Abstract, Publication No. KR 10-2002-0034272.

Korean Patent Abstract, Publication No. KR 10-2002-0056238.

Korean Patent Abstract, Publication No. KR 10-2002-0088662.

Korean Patent Abstract, Publication No. KR 10-2005-0045619.

Korean Patent Abstract, Publication No. KR 10-2006-0126267.

Korean Patent Abstract, Publication No. KR 10-2008-0038650.

Korean Patent Abstracts for Korean Publication 10-2007-0097218 dated Oct. 4, 2007, corresponding to Korean Patent 10-0768212 dated Oct. 18, 2007 listed above.

Machine English Translation for JP-2001-052862 A, dated Feb. 23, 2001 listed above (20 pages).

Machine English Translation for JP-2003-003250 A, dated Jan. 8, 2003 listed above (25 pages).

Patent Abstracts of Japan, and English machine translation of Japanese Publication 2009-024208 listed above, (30 pages).

U.S. Notice of Allowance, dated Mar. 18, 2013, corresponding to U.S. Appl. No. 12/795,001 (29 pages).

U.S. Office action dated Feb. 26, 2013, corresponding to U.S. Appl. No. 12/794,093 (31 pages).

U.S. Office action dated Mar. 18, 2013, corresponding to U.S. Appl. No. 12/984,231 (29 pages).

U.S. Office action dated Mar. 19, 2013, corresponding to U.S. Appl. No. 12/194,759 (36 pages).

U.S. Office action dated Mar. 22, 2013, corresponding to U.S. Appl. No. 12/987,569 (12 pages).

U.S. Office action dated May 7, 2013, corresponding to U.S. Appl. No. 12/820,270 (37 pages).

U.S. Office action dated Dec. 20, 2012, corresponding to U.S. Appl. No. 12/984,289 (20 pages).

U.S. Office action dated Apr. 1, 2013 for cross reference U.S. Appl. No. 12/784,774, (44 pages).

U.S. Office action dated Aug. 13, 2013 for cross reference U.S. Appl. No. 13/194,759, (28 pages).

U.S. Office action dated Dec. 17, 2012 for cross reference U.S. Appl. No. 12/873,556 (37 pages).

(56) References Cited

OTHER PUBLICATIONS

U.S. Office action dated Dec. 26, 2012 for cross reference U.S. Appl. No. 12/815,673, (21 pages).
U.S. Office action dated Jan. 25, 2013 for cross reference U.S. Appl. No. 13/015,357, (21 pages).
U.S. Office action dated Jul. 17, 2013, for cross reference U.S. Appl. No. 12/984,231, (18 pages).
U.S. Office action dated Jul. 3, 2013 for cross reference U.S. Appl. No. 12/873,689, (48 pages).
U.S. Office action dated Jun. 11, 2013 for cross reference U.S. Appl. No. 12/862,125, (37 pages).
U.S. Office action dated Jun. 26, 2013 for cross reference U.S. Appl. No. 12/794,093, (20 pages).
U.S. Office action dated Mar. 15, 2013 for cross reference U.S. Appl. No. 12/813,786, (33 pages).
U.S. Office action dated May 24, 2013 for cross reference U.S. Appl. No. 12/849,092, (31 pages).
U.S. Office action dated Sep. 12, 2012 for cross reference U.S. Appl. No. 12/815,673 (26 pages).
U.S. Office action dated Oct. 11, 2013 for Parent U.S. Appl. No. 12/907,396 (44 pages).
European Search Report dated May 13, 2011 for European Application No. 11250019.4 (6 pages).
European Search Report dated May 20, 2011 or European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Oct. 27, 2011 for Korean Application No. 10-2010-0002381 (5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2000-0045201 (5 pages).
KIPO Notice of Allowance dated Sep. 28, 2011 for Korean Application No. 10-2009-0052359 (5 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Feb. 1, 2012, for Korean Patent application 10-2010-0013847 (5 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011 for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 1, 2012, issued to U.S. Appl. No. 13/277,112 (19 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jan. 27, 2014 for U.S. Appl. No. 12/987,569 (9 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated Mar. 7, 2013, issued to U.S. Appl. No. 13/244,110 (9 pages).
U.S. Notice of Allowance dated May 9, 2014 for U.S. Appl. No. 13/194,759 (27 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office Action dated Aug. 2, 2013 for U.S. Appl. No. 12/868,099 (32 pages).
U.S. Office action dated Aug. 21, 2013 issued to U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 2, 2013, issued to U.S. Appl. No. 13/157,220 (33 pages).
U.S. Office action dated Feb. 11, 2014, for cross reference U.S. Appl. No. 13/178,472 (8 pages).

(56) References Cited

OTHER PUBLICATIONS

U.S. Office Action dated Feb. 6, 2014, for U.S. Appl. No. 12/984,231 (16 pages).
U.S. Office action dated Jul. 11, 2013 for U.S. Appl. No. 13/461,669 (27 pages).
U.S. Office action dated Jul. 24, 2013, issued to U.S. Appl. No. 12/784,804, (52 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Mar. 17, 2014, for U.S. Appl. No. 12/950,361 (48 pages).
U.S. Office Action dated Mar. 23, 2012 for U.S. Appl. No. 12/849,193 (17 pages).
U.S. Office action dated May 21, 2014, issued to U.S. Appl. No. 13/014,225 (15 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 6, 2014, issued to U.S. Appl. No. 13/467,998 (21 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 21, 2013 issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).

* cited by examiner

METHOD OF DEPOSITING A THIN FILM

CROSS-REFERENCE TO RELATED PATENT APPLICATIONS

This application is a Divisional of U.S. patent application Ser. No. 12/907,396, filed Oct. 19, 2010, which has issued as U.S. Pat. No. 8,876,975 on Nov. 4, 2014, which claims priority to and the benefit of Korean Application Nos. 10-2009-0099314, filed on Oct. 19, 2009 and 10-2010-0014277, filed on Feb. 17, 2010, in the Korean Intellectual Property Office, the entire disclosures of all of which are incorporated herein by reference.

BACKGROUND

1. Field

A thin film deposition apparatus that can be simply applied to produce large-sized display devices on a mass scale and that improves manufacturing yield.

2. Description of Related Art

Organic light-emitting display devices have a larger viewing angle, better contrast characteristics, and a faster response rate than other display devices, and thus have drawn attention as next-generation display devices.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus light is emitted. However, it is difficult to achieve high light-emission efficiency with such a structure, and thus intermediate layers, including an electron injection layer, an electron transport layer, a hole transport layer, a hole injection layer, or the like, are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5G or more, by using a conventional thin film deposition apparatus, and thus it is difficult to manufacture large organic light-emitting display devices having satisfactory driving voltage, current density, brightness, color purity, light-emission efficiency, or life-span characteristics. Thus, there is a demand for improvement in this regard.

An organic light-emitting display device includes intermediate layers, including an emission layer disposed between a first electrode and a second electrode where the electrodes are arranged opposite to each other. The interlayer and the first and second electrodes may be formed using a variety of methods, one of which is a deposition method. When an organic light-emitting display device is manufactured by using the deposition method, a fine metal mask (FMM) having the same pattern as the thin film to be formed is disposed to closely contact a substrate, and a thin film material is deposited over the FMM in order to form the thin film having the desired pattern.

SUMMARY

Aspects of the present invention provide a thin film deposition apparatus that may be easily manufactured, that may be simply applied to produce large-sized display devices on a mass scale, that improves manufacturing yield and deposition efficiency, and that allows deposited materials to be reused.

An aspect of the present invention provides a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in the first direction; wherein each of the patterning slits includes a plurality of sub-slits.

The gap between the neighboring patterning slits may be greater than the gap between the neighboring sub-slits included in one patterning slit.

The sub-slits may be arranged so that at least a part of the pattern that is formed of the deposition material discharged from one of the sub-slits included in one patterning slit towards the substrate and at least a part of the pattern that is formed of the deposition material discharged from the other of the sub-slits included in one patterning slit towards the substrate may overlap each other.

The plurality of sub-slits may be rectangles arranged in parallel with each other.

The plurality of sub-slits may be holes arranged in a plurality of rows which are in parallel with each other.

The thin film deposition apparatus may be separate from the substrate by a predetermined distance, and the substrate may be movable relative to the thin film deposition apparatus.

The deposition materials contained in the deposition sources of the thin film deposition apparatus may be continuously deposited on the substrate while the substrate or the thin film deposition apparatus is moved relative to the other.

The thin film deposition apparatus or the substrate may be movable relative to the other along a plane parallel to a surface of the substrate on which the deposition materials are deposited.

The patterning slit sheet of the thin film deposition apparatus may be smaller than the substrate.

The total number of the patterning slits may be greater than a total number of the deposition source nozzles.

According to another aspect of the present invention, a thin film deposition apparatus for forming a thin film on a substrate, includes: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits arranged in a second direction perpendicular to the first direction, wherein a deposition is performed while the substrate or the thin film deposition apparatus moves relative to the other in the first direction, the deposition source, the deposition source nozzle unit, and the patterning slit sheet are formed integrally with each other, and each of the patterning slits includes a plurality of sub-slits.

The gap between the neighboring patterning slits may be greater than the gap between the neighboring sub-slits included in one patterning slit.

The sub-slits may be arranged so that at least a part of the pattern that is formed of the deposition material discharged from one of the sub-slits included in one patterning slit towards the substrate and at least a part of the pattern that is formed of the deposition material discharged from the other of the sub-slits included in one patterning slit towards the substrate may overlap each other.

The plurality of sub-slits may be formed as rectangles arranged in parallel with each other.

The plurality of sub-slits may be holes arranged in a plurality of rows which are parallel with each other.

The deposition source, the deposition source nozzle unit, and the patterning slit sheet may be connected to each other by a connection member.

The connection member may guide movement of the discharged deposition material.

The connection member may seal a space between the deposition source and the deposition source nozzle unit, and the patterning slit sheet.

The thin film deposition apparatus may be separate from the substrate by a predetermined distance.

The deposition material discharged from the thin film deposition apparatus may be continuously deposited on the substrate while the substrate or the thin film deposition apparatus is moved relative to the other in the first direction.

The patterning slit sheet of the thin film deposition apparatus may be smaller than the substrate.

The plurality of deposition source nozzles may be tilted at a predetermined angle.

The plurality of deposition source nozzles may include deposition source nozzles arranged in two rows formed in the first direction, and the deposition source nozzles in the two rows may tilt to face each other.

The plurality of deposition source nozzles may include deposition source nozzles arranged in two rows formed in the first direction, the deposition source nozzles arranged in a row located at a first side of the patterning slit sheet may be arranged to face a second side of the patterning slit sheet, and the deposition source nozzles arranged in the other row located at the second side of the patterning slit sheet may be arranged to face the first side of the patterning slit sheet.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
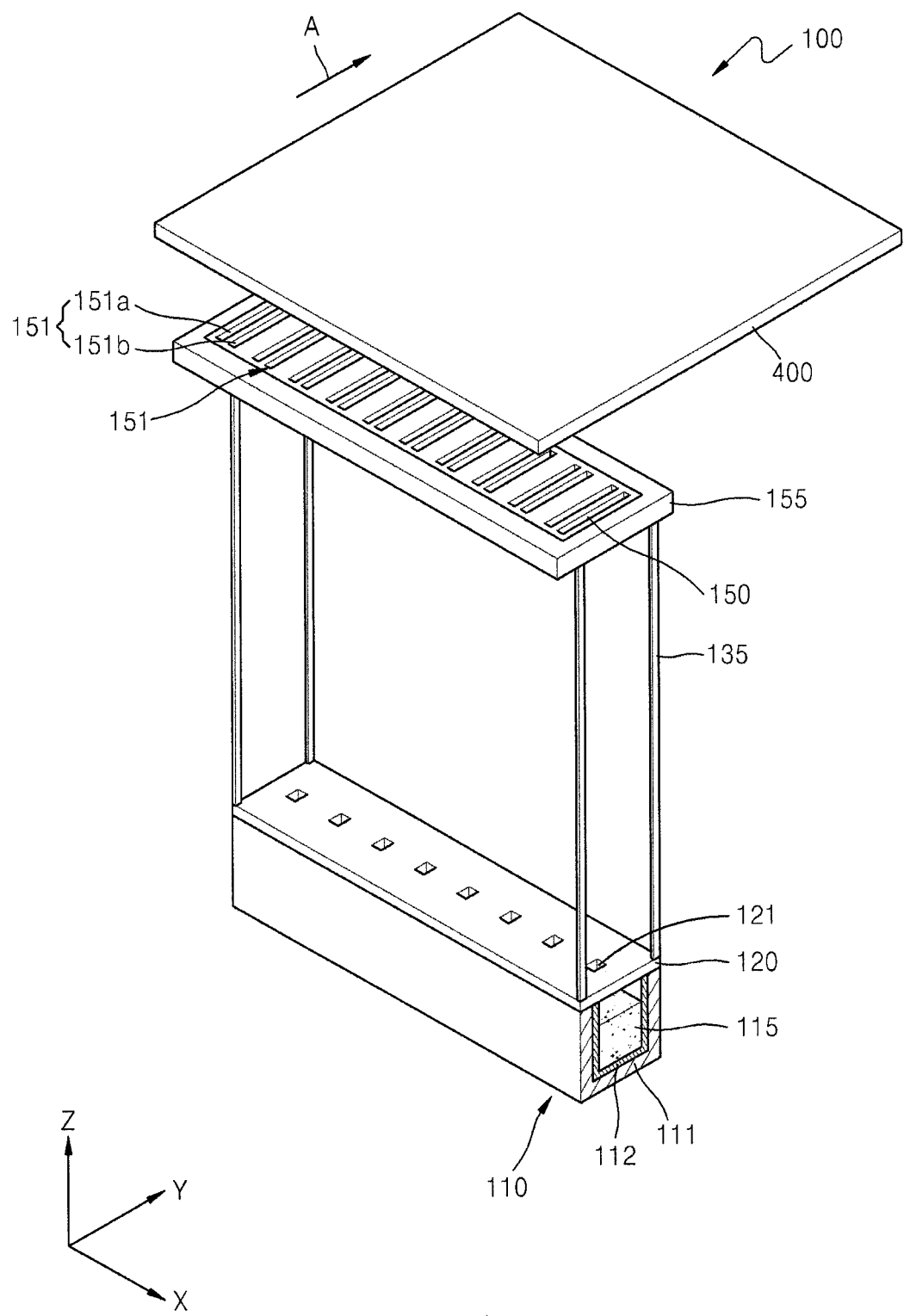
FIG. 1 is a schematic perspective view of a thin film deposition apparatus according to an embodiment of the present invention.
Figure 2:
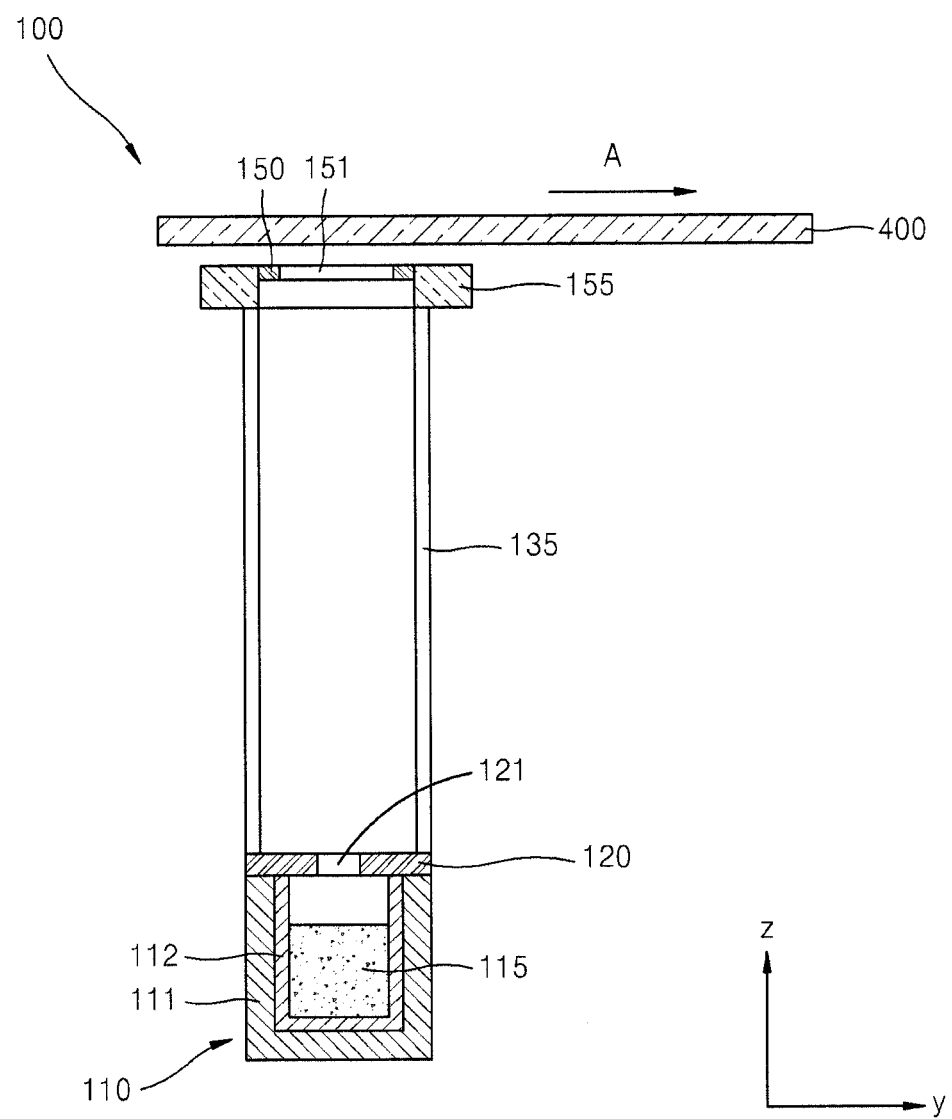
FIG. 2 is a schematic side view of the thin film deposition apparatus of FIG. 1.
Figure 3:
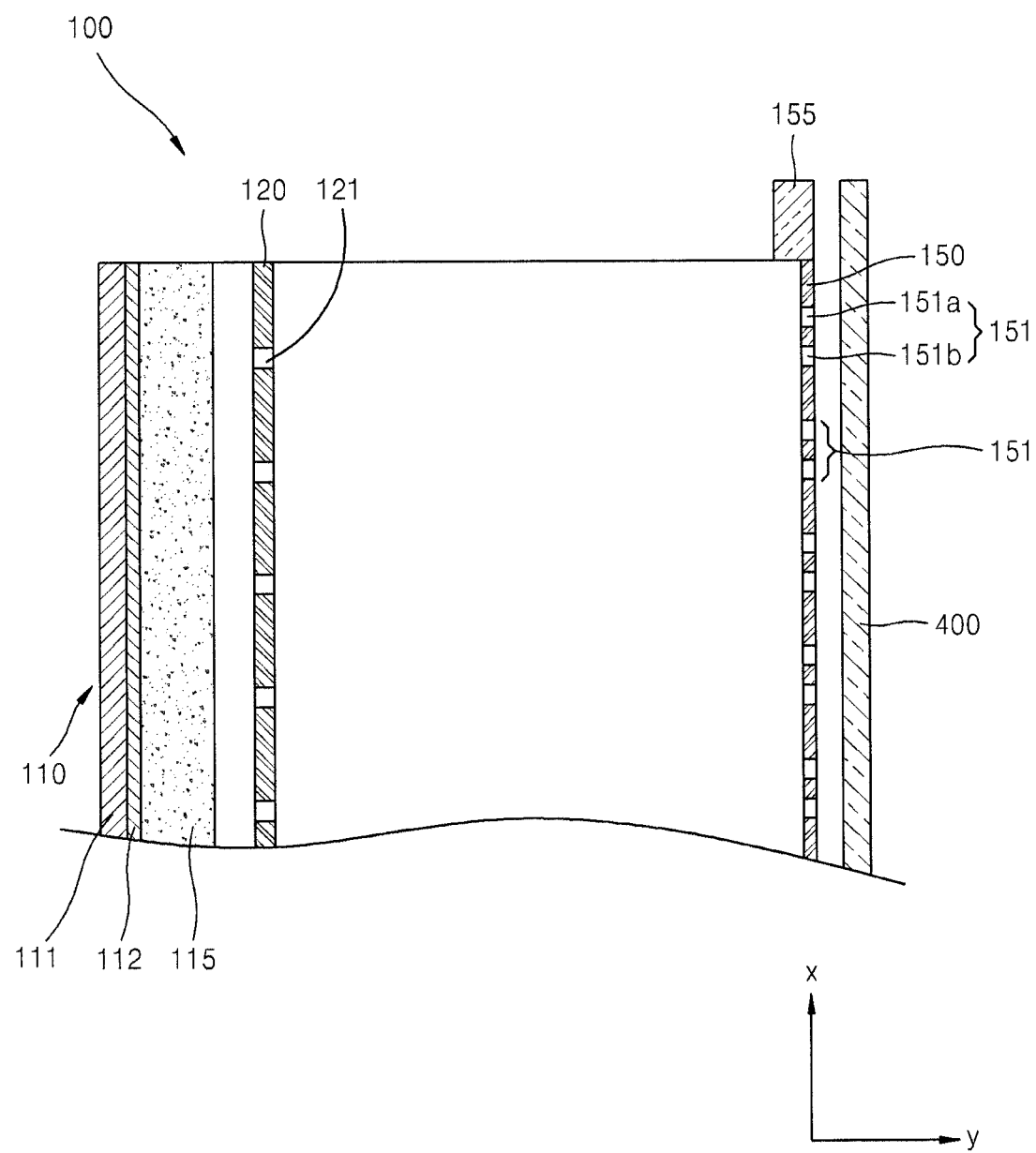
FIG. 3 is a schematic plan view of the thin film deposition apparatus of FIG. 1.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one structure is "formed on" or "disposed on" a second structure, the first structure may be formed or disposed directly on the second structure or there may be an intervening structure between the first structure and the second structure. Further, as used herein, the term "formed on" or "disposed on" are used with the same meaning as "located on" and are not meant to be limiting regarding any particular fabrication process FIG. 1 is a schematic perspective view of a thin film deposition apparatus 100 according to an embodiment of the present invention, FIG. 2 is a schematic side view of the thin film deposition apparatus 100, and FIG. 3 is a schematic plan view of the thin film deposition apparatus 100. Referring to FIGS. 1, 2 and 3, the thin film deposition apparatus 100 according to the current embodiment of the present invention includes a deposition source 110, a deposition source nozzle unit 120, and a patterning slit sheet 150.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

In particular, in order to deposit a deposition material 115 that is emitted from the deposition source 110 and is discharged through the deposition source nozzle unit 120 and the patterning slit sheet 150, onto a substrate 400 in a desired pattern, it is required to maintain the chamber in a high-vacuum state as in a deposition method using a fine metal mask (FMM). In addition, the temperature of the patterning slit sheet 150 has to be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 400, which constitutes a target on which a deposition material 115 is to be deposited, is disposed in the chamber. The substrate 400 may be a substrate for flat panel displays. A large substrate, such as a mother glass, for manufacturing a plurality of flat panel displays may be used as the substrate 400. Other substrates may also be employed. In the current embodiment of the present invention, deposition may be performed while the substrate 400 or the thin film deposition apparatus 100 is moved relative to the other.

In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM and still have the FMM be accurately aligned with a pattern.

In order to overcome this problem, in the thin film deposition apparatus 100 according to the current embodiment of the present invention, deposition may be performed while the thin film deposition apparatus 100 or the substrate 400 is moved relative to the other. In other words, deposition may be continuously performed while the substrate 400, which is disposed so as to face the thin film deposition apparatus 100, is moved in the Y-axis direction. In other words, for example, deposition is performed in a scanning manner while the substrate 400 is moved in the direction of arrow A in FIGS. 1 and 3. Although the substrate 400 is illustrated as being moved in the Y-axis direction in FIGS. 1 and 3 when deposition is performed, the present invention is not limited thereto. For example, deposition may be performed while the thin film deposition apparatus 100 is moved in the Y-axis direction, whereas the substrate 400 is fixed.

Thus, in the thin film deposition apparatus 100 according to the current embodiment of the present invention, the patterning slit sheet 150 may be significantly smaller than an FMM used in a conventional deposition method. In other words, in the thin film deposition apparatus 100 according to the current embodiment of the present invention, deposition is continuously performed, i.e., in a scanning manner, while the substrate 400 is moved in the Y-axis direction. Thus, lengths of the patterning slit sheet 150 in the X-axis and Y-axis directions may be significantly less than the lengths of the substrate 400 in the X-axis and Y-axis directions. As described above, since the patterning slit sheet 150 may be formed to be significantly smaller than an FMM used in a conventional deposition method, it is relatively easy to manufacture the patterning slit sheet 150 used in aspects of the present invention. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 100 or the substrate 400 is moved relative to the other as described above, the thin film deposition apparatus 100 and the substrate 400 may be separate from each other by a predetermined distance. This will be described later in detail.

The deposition source 110 that contains and heats the deposition material 115 is disposed in an opposite side of the chamber to that in which the substrate 400 is disposed. As the deposition material 115 contained in the deposition source 110 is vaporized, the deposition material 115 is deposited on the substrate 400.

In particular, the deposition source 110 includes a crucible 111 that is filled with the deposition material 115, and a heater 112 that heats the crucible 111 to vaporize the deposition material 115 that is contained in the crucible 111 toward a side of the crucible 111, and in particular, toward the deposition source nozzle unit 120.

The deposition source nozzle unit 120 is disposed at a side of the deposition source 110, and in particular, at the side of the deposition source 110 facing the substrate 400. The deposition source nozzle unit 120 includes a plurality of deposition source nozzles 121 arranged at equal intervals in the X-axis direction. The deposition material 115 that is vaporized in the deposition source 110 passes through the deposition source nozzle unit 120 toward the substrate 400 that is a deposition target.

The patterning slit sheet 150 and a frame 155 in which the patterning slit sheet 150 is held are disposed between the deposition source 110 and the substrate 400. The frame 155 may be formed in a lattice shape, similar to a window frame. The patterning slit sheet 150 is held inside the frame 155. The patterning slit sheet 150 includes a plurality of patterning slits 151 arranged in the X-axis direction. That is, the patterning slits 151 are parallel to each other, and the resulting deposition pattern is generally rectangular. The deposition material 115 that is vaporized in the deposition source 110 passes through the deposition source nozzle unit 120 and the patterning slit sheet 150 toward the substrate 400. The patterning slit sheet 150 may be manufactured by etching, which is the same method as used in a conventional method of manufacturing an FMM, and in particular, a striped FMM. Here, the total number of patterning slits 151 may be greater than the total number of deposition source nozzles 121.

In the thin film deposition apparatus 100 of the current embodiment of the present invention, each of the patterning slits 151 includes a plurality of sub-slits 151a and 151b. As described above, each of the patterning slits 151 includes the plurality of sub-slits 151a and 151b, and when the sub-slits 151a and 151b are arranged so that patterns formed by the plurality of sub-slits 151a and 151b overlap each other, desired patterns may be obtained. This will be described later in detail.

In addition, the deposition source 110 (and the deposition source nozzle unit 120 coupled to the deposition source 110) and the patterning slit sheet 150 may be formed to be separate from each other by a predetermined distance. Alternatively, the deposition source 110 (and the deposition source nozzle unit 120 coupled to the deposition source 110) and the patterning slit sheet 150 may be connected by a connection member 135.

As described above, the thin film deposition apparatus 100 according to the current embodiment of the present invention performs deposition while being moved relative to the substrate 400. In order to move the thin film deposition apparatus 100 relative to the substrate 400, the patterning slit sheet 150 is separate from the substrate 400 by a predetermined distance. In addition, when the patterning slit sheet 150 and the substrate 400 are separate from each other by a predetermined distance, a shadow zone may be generated on the substrate 400 and the desired pattern may not be obtained. In order to overcome the above and/or other problems, according to the thin film deposition apparatus 100 of the current embodiment, one patterning slit 151 includes the plurality of sub-slits 151a and 151b, and the desired pattern is formed by overlapping the patterns formed by the plurality of sub-slits 151a and 151b.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 100 according to the current embodiment of the present invention, the patterning slit sheet 150 is disposed to be separate by a predetermined distance from the substrate 400 that is the deposition target. This is realized by forming each of the patterning slits 151 to include a pair of sub-slits 151a and 151b, and forming the desired pattern by using the overlapping of the patterns formed by the pair of sub-slits 151a and 151b.

As described above, according to these aspects of the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

Hereinafter, a pattern formed in the conventional method using the FMM, a pattern formed when the substrate 400 is separate from the patterning slit sheet 150 by a predetermined distance and the patterning slit is a single slit, and a pattern formed when the substrate 400 is separate from the patterning slit sheet 150 and the patterning slit includes a plurality of sub-slits will be compared with each other in detail.

Figure 4A:
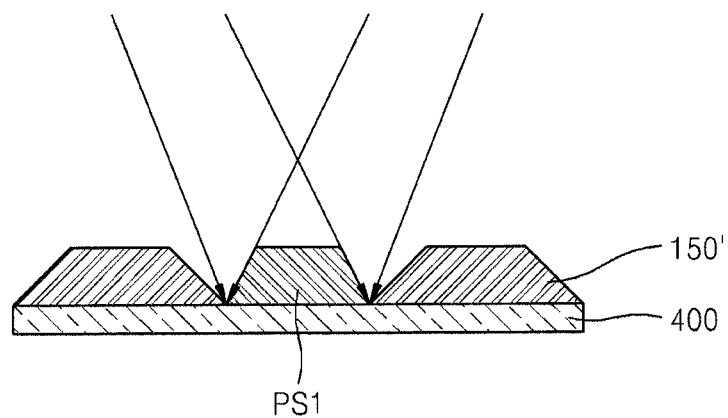
FIG. 4A is a cross-sectional view of a pattern formed in a fine metal mask (FMM)

As shown in FIG. 4A, a mask 150' and the substrate 400 are in close contact to each other in the conventional method using the FMM. Therefore, a shadow zone is not generated on the substrate 400 and a desired pattern PS1 may be obtained. However, when the FMM is used in close contact with the substrate, the contact may cause defects. In addition, in the conventional deposition method using the FMM, the size of the mask has to be the same as the size of the substrate since the mask cannot be moved relative to the substrate.

Figure 4B:
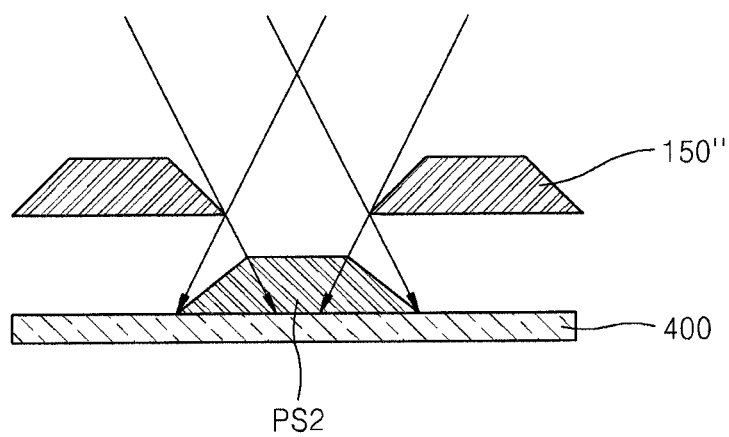
FIG. 4B is a cross-sectional view of a pattern when a substrate and a patterning slit sheet are separate from each other and a single slit forms a patterning slit, according to an embodiment of the present invention.

On the other hand, as shown in FIG. 4B, when the patterning slit is a single slit, a mask 150" having a size that is less than that of the substrate 400 is formed, and then, the deposition is performed while moving the mask 150" relative to the substrate 400. Thus, it is easy to fabricate the mask 150", and defects caused due to the close contact between the substrate 400 and the mask 150" may be prevented. However, in this case, since the mask 150" is separate by a predetermined distance from the substrate 400, a shadow zone is inevitably generated on the substrate 400, and thus, a desired pattern PS2 may not be formed.

Figure 5A:
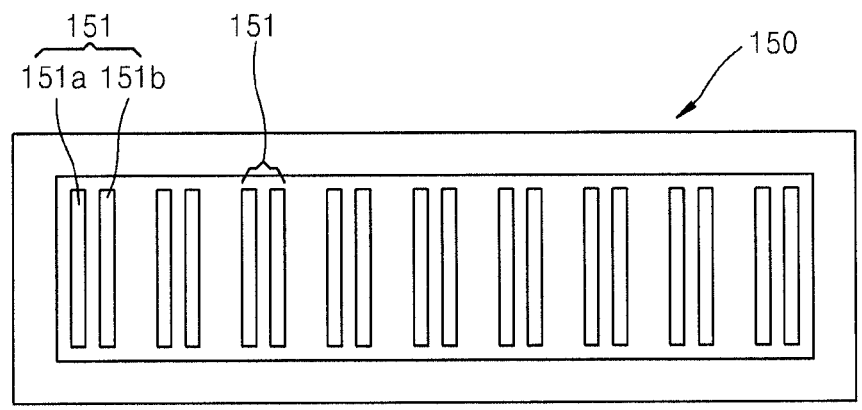
FIG. 5A is a plan view of a patterning slit sheet in the thin film deposition apparatus of FIG. 1.

To overcome the above problem, in the thin film deposition apparatus 100 according to the current embodiment of the present invention, one patterning slit 151 is formed by using a plurality of sub-slits 151a and 151b, and the desired pattern is formed by using overlapping of the patterns formed through the plurality of sub-slits 151a and 151b. That is, as shown in FIG. 5A, one patterning slit 151 includes two sub-slits 151a and 151b. That is, the gap between two neighboring patterning slits 151 is greater than a gap between two neighboring sub-slits 151a and 151b that form one patterning slit 151.

Figure 5B:
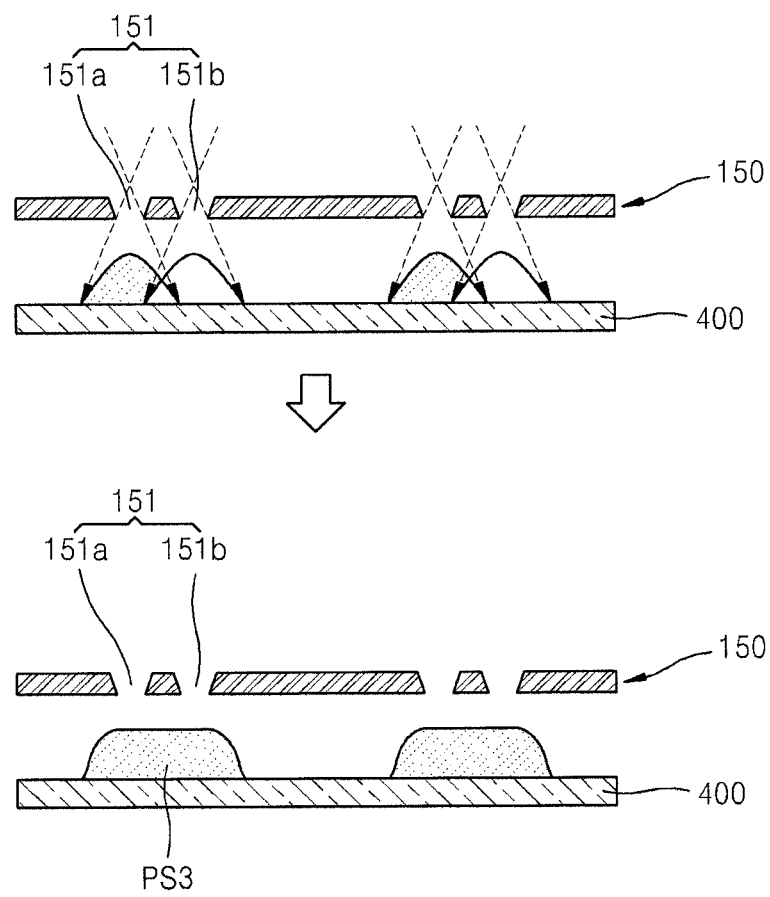
FIG. 5B is a cross-sectional view showing the patterning slit sheet of FIG. 5A and a pattern formed by the patterning slit sheet of FIG. 1.

FIG. 5B shows a pattern formed through the patterning slit sheet 150. That is, the pattern formed of the deposition material discharged through the first sub-slit 151a toward the substrate 400 and the pattern formed of the deposition material discharged through the second sub-slit 151b toward the substrate 400 are formed so that at least some parts of the patterns overlap each other. The upper end portion of the overlap pattern becomes flat due to the spreading effect of vaporized particles, and consequently, a single pattern PS3 of a predetermined shape is formed, which is similar to the pattern PS1 formed by the deposition method using the FMM.

Figure 5C:
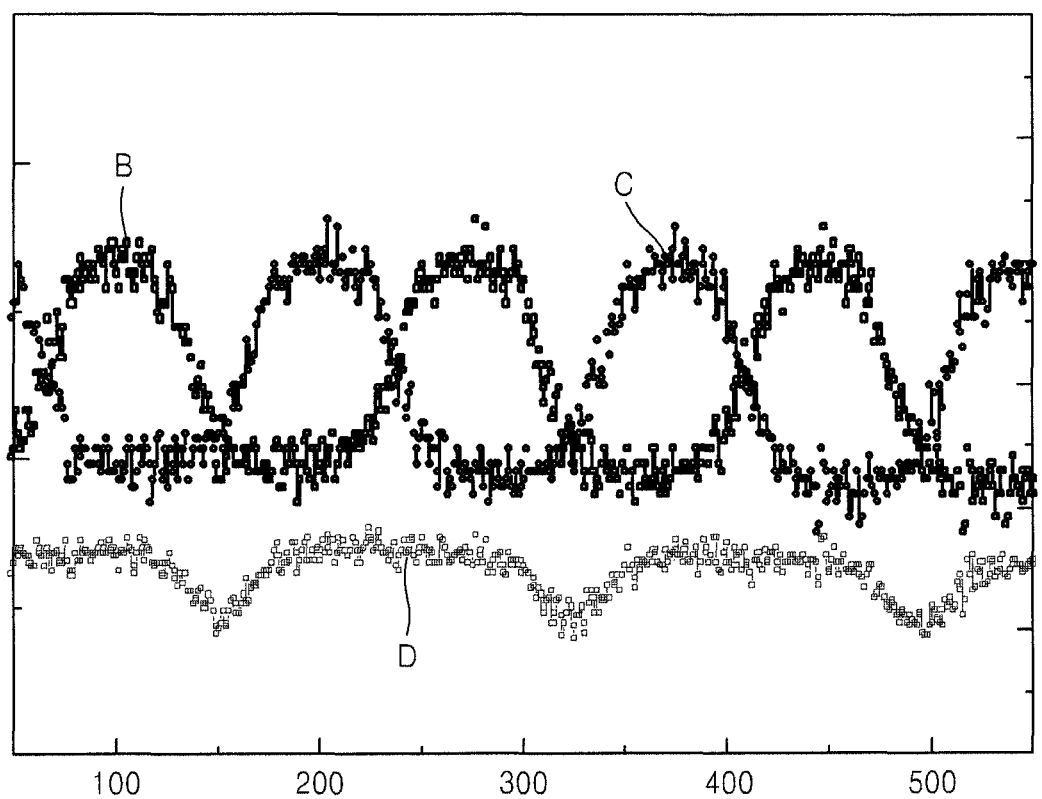
FIG. 5C is a graph showing experimental results when a new pattern was formed by overlapping a plurality of patterns, according to the embodiment of FIG. 1.

FIG. 5C is a graph illustrating experimental results when a new pattern was formed by overlapping a plurality of patterns with each other. As shown in FIG. 5C, two patterns B and C that were formed by two neighboring sub-slits that combined to form a new type pattern D.

Although one patterning slit 151 includes two sub-slits 151a and 151b in FIGS. 5A and 5B, the present invention is not limited thereto. That is, one patterning slit 151 may include two or more sub-slits. The number of the sub-slits, the gap between the sub-slits, and the gap between the patterning slits may be dependent upon the shape of the desired pattern.

Figure 6A:
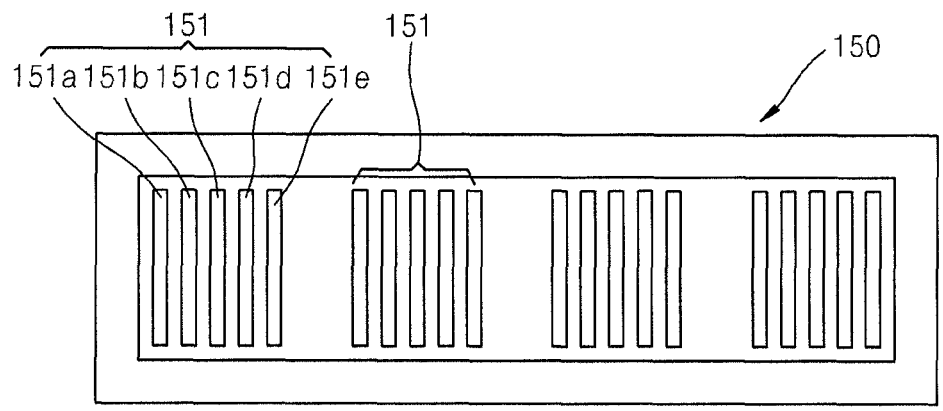
FIG. 6A is a plan view of a patterning slit sheet in a thin film deposition apparatus according to a modified example of the embodiment of FIG. 1.
Figure 6B:
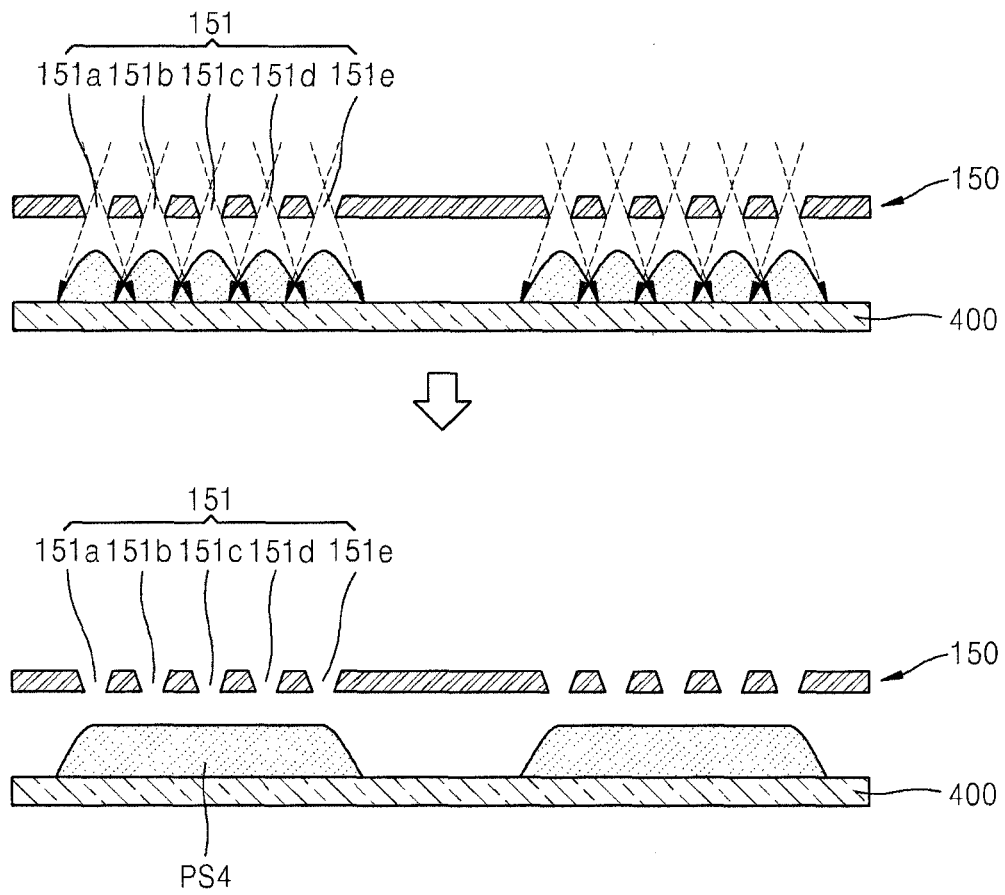
FIG. 6B is a cross-sectional view of the patterning slit sheet of FIG. 6A and a pattern formed by the patterning slit sheet.
Figure 7A:
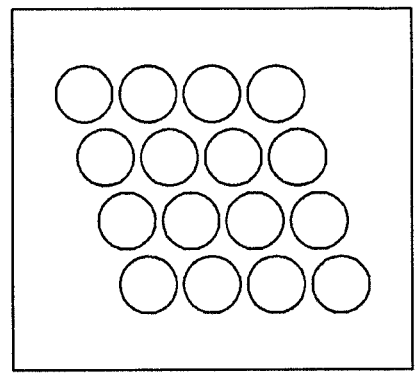
FIGS. 7A and 7B are plan views of patterning slit sheets in a thin film deposition apparatus, according to other modified examples of the embodiment of FIG. 1.
Figure 7B:
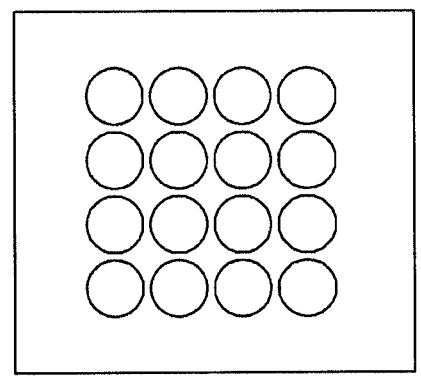

For example, as shown in FIG. 6A, one patterning slit 151 may include five sub-slits 151a, 151b, 151c, 151d, and 151e that are parallel to each other. Here, the pattern formed of the deposition material deposited on the substrate 400 through each of the sub-slits overlaps the pattern formed of the deposition material deposited on the substrate 400 through the neighboring sub-slit by at least a part. The upper portion of the overlapped pattern becomes flat due to the spreading effect of vaporized particles, and consequently, a single pattern PS4 of a predetermined shape is formed, which is similar to the pattern PS1 formed by the conventional deposition method using the FMM. The predetermined shape is generally a rectangle. Otherwise, as shown in FIGS. 7A and 7B, the patterning slit may include a plurality of sub-slits formed as holes, and thus, a square or other desired shape pattern may be formed.

According to this embodiment of the present invention, the desired pattern may be formed even when the substrate and the mask are separate from each other by the predetermined distance, and thus, the mask may be easily fabricated, defects caused by close contact between the substrate and the mask may be prevented, and the fabricating speed of the thin film deposition apparatus may be improved.

Figure 8:
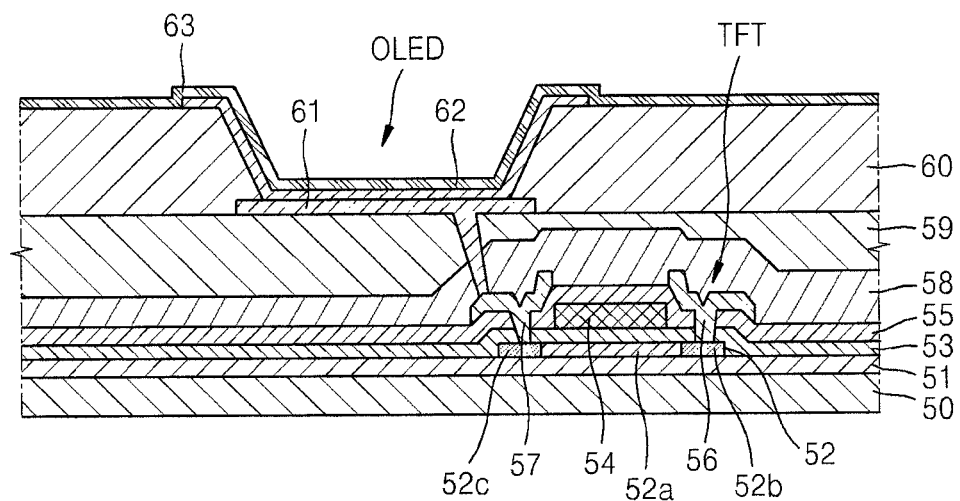
FIG. 8 is a schematic cross-sectional view of an organic light-emitting display device manufactured by using a thin film deposition apparatus, according to another embodiment of the present invention.

FIG. 8 is a cross-sectional view of an active matrix organic light emitting display device fabricated by using a thin film deposition apparatus, according to another embodiment of the present invention. Referring to FIG. 8, a buffer layer 51 is formed on a substrate 50 formed of glass or plastic. A thin film transistor (TFT) and an organic light emitting diode (OLED) are formed on the buffer layer 51.

An active layer 52 having a predetermined pattern is formed on the buffer layer 51 of the substrate 50. A gate insulating layer 53 is formed on the active layer 52, and a gate electrode 54 is formed in a predetermined region of the gate insulating layer 53. The gate electrode 54 is connected to a gate line (not shown) that applies ON/OFF signals to the TFT. An interlayer insulating layer 55 is formed on the gate electrode 54. Source/drain electrodes 56 and 57 are formed such as to contact source/drain regions 52b and 52c, respectively, of the active layer 52 through contact holes. A passivation layer 58 is formed of $SiO_2$, $SiN_x$, or the like, on the source/drain electrodes 56 and 57. A planarization layer 59 is formed of an organic polymeric material, such as an acrylic, a polyimide, benzocyclobutene (BCB) polymer, or the like, on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on the surface of the pixel defining layer 60 and on the surface of the pixel electrode 61 exposed through the opening. The organic layer 62 includes an emission layer. The present invention is not limited to the structure of the organic light-emitting display device described above, and various structures of organic light-emitting display devices may be used in the present invention.

The OLED displays predetermined image information by emitting red, green and blue light as current flows. The OLED includes the pixel electrode 61, which is connected to the drain electrode 56 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light. The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials include copper phthalocyanine (CuPc), N,N'-di(naphthalene-1-yl)-N,N'-diphenyl-benzidine (d-NPB), tris-8-hydroxyquinoline aluminum (Alq3), and the like. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like. The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound or mixture thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 including the emission layer may be formed by using a thin film deposition apparatus 100 (see FIG. 1), which is described above. The thin film deposition apparatuses according to the embodiments of the present invention described above may be applied to form an organic layer or an inorganic layer of an organic TFT, and to form layers from various materials.

Figure 9:
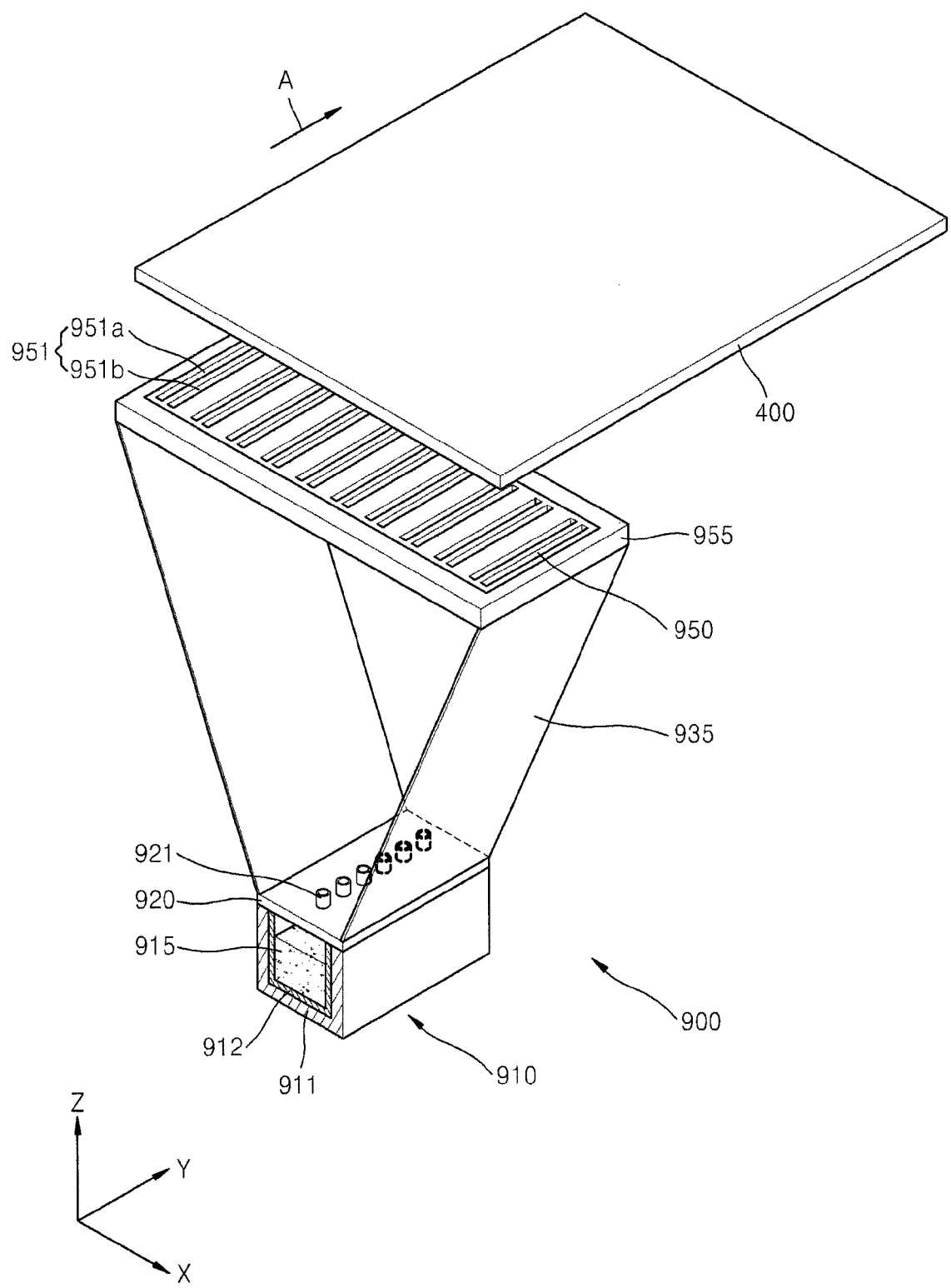
FIG. 9 is a schematic perspective view of a thin film deposition apparatus according to another embodiment of the present invention.
Figure 10:
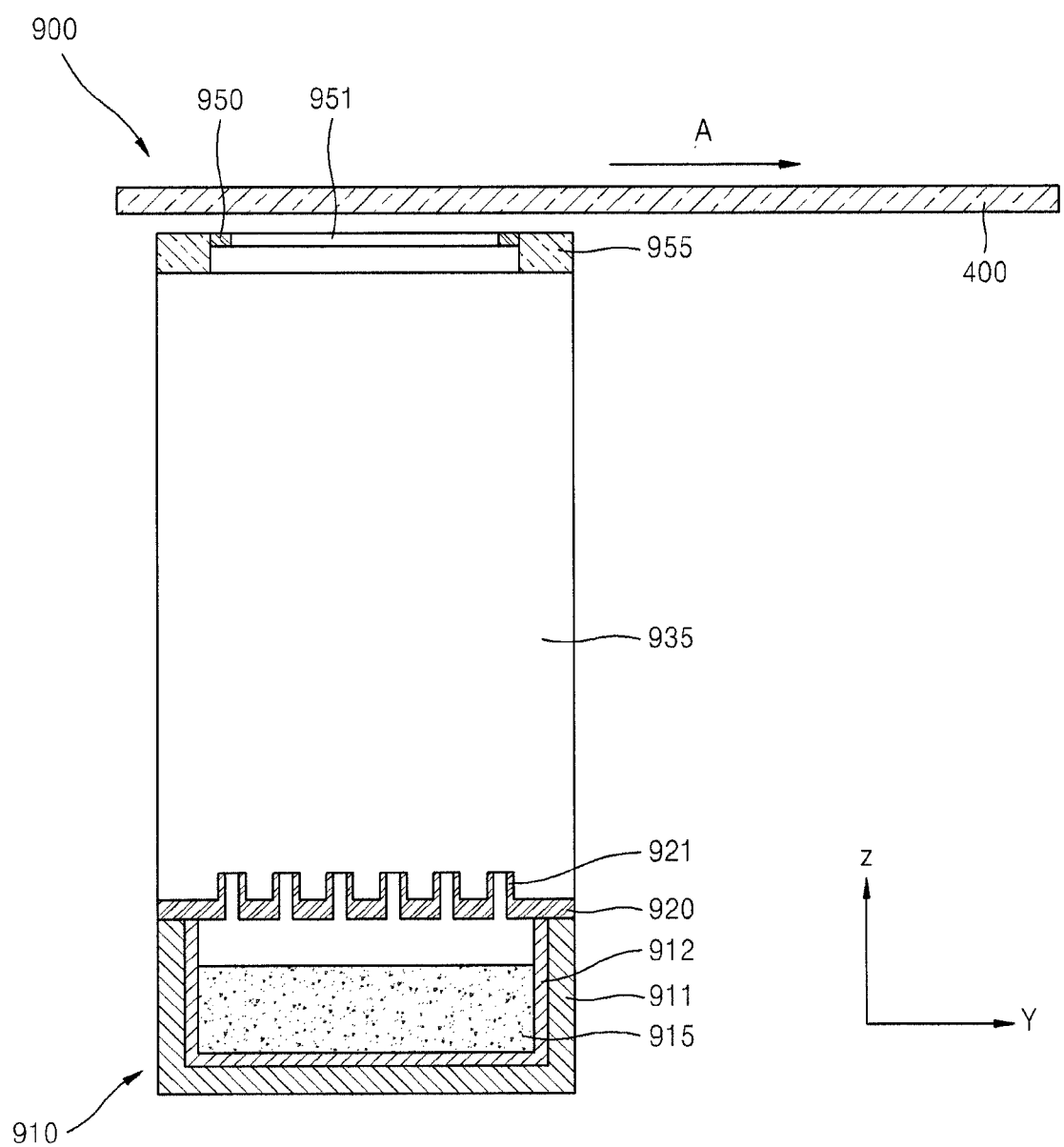
FIG. 10 is a schematic side view of the thin film deposition apparatus of FIG. 9.
Figure 11:
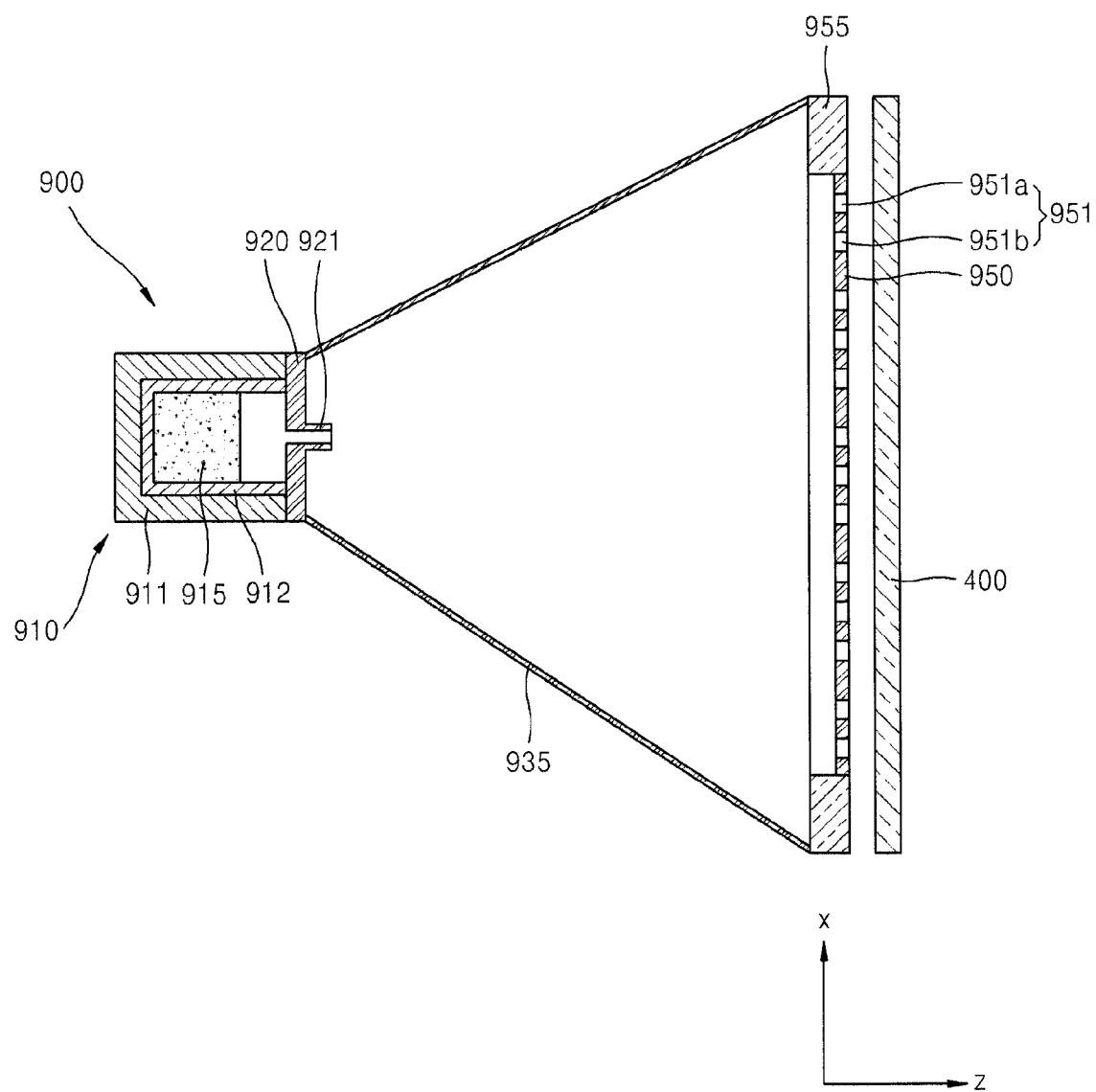
FIG. 11 is a schematic plan view of the thin film deposition apparatus of FIG. 9.

FIG. 9 is a schematic perspective view of a thin film deposition apparatus 900 according to another embodiment of the present invention, FIG. 10 is a schematic side view of the thin film deposition apparatus 900, and FIG. 11 is a schematic plan view of the thin film deposition apparatus 900.

Referring to FIGS. 9, 10 and 11, the thin film deposition apparatus 900 according to the current embodiment of the present invention includes a deposition source 910, a deposition source nozzle unit 920, and a patterning slit sheet 950. Although a chamber is not illustrated in FIGS. 9, 10 and 11 for convenience of explanation, all the components of the thin film deposition assembly 900 may be disposed within a chamber that is maintained at an appropriate degree of vacuum. The chamber is maintained at an appropriate vacuum in order to allow a deposition material to move in a substantially straight line through the thin film deposition apparatus 900.

In particular, in order to deposit a deposition material 915 that is emitted from the deposition source 910 and is discharged through the deposition source nozzle unit 920 and the patterning slit sheet 950, onto a substrate 400 in a desired pattern, it is required to maintain the chamber in a high-vacuum state as in a deposition method using a fine metal mask (FMM). In addition, the temperature of the patterning slit sheet 950 has to be sufficiently lower than the temperature of the deposition source 910. In this regard, the temperature of the patterning slit sheet 150 may be about 100° C. or less. The temperature of the patterning slit sheet 950 should be sufficiently low so as to reduce thermal expansion of the patterning slit sheet 950.

The substrate 400, which constitutes a target on which a deposition material 915 is to be deposited, is disposed in the chamber. The substrate 400 may be a substrate for flat panel displays. A large substrate, such as a mother glass, for manufacturing a plurality of flat panel displays, may be used as the substrate 400. Other substrates may also be employed.

In the current embodiment of the present invention, deposition may be performed while the substrate 400 or the thin film deposition assembly 900 is moved relative to the other. In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to have the FMM be accurately aligned with a pattern.

In order to overcome this problem, in the thin film deposition assembly 900 according to the current embodiment of the present invention, deposition may be performed while the thin film deposition assembly 900 or the substrate 400 is moved relative to the other. In other words, deposition may be continuously performed while the substrate 400, which is disposed such as to face the thin film deposition assembly 900, is moved in a Y-axis direction. In other words, deposition is performed in a scanning manner while the substrate 400 is moved in the direction of arrow A in FIG. 9. Although the substrate 400 is illustrated as being moved in the Y-axis direction in FIG. 9 when deposition is performed, the present invention is not limited thereto. Deposition may be performed while the thin film deposition assembly 900 is moved in the Y-axis direction, whereas the substrate 400 is fixed.

Thus, in the thin film deposition assembly 900 according to the current embodiment of the present invention, the patterning slit sheet 950 may be significantly smaller than an FMM used in a conventional deposition method. In other words, in the thin film deposition assembly 900 according to the current embodiment of the present invention, deposition is continuously performed, i.e., in a scanning manner while the substrate 400 is moved in the Y-axis direction. Thus, lengths of the patterning slit sheet 950 in the X-axis and Y-axis directions may be significantly less than the lengths of the substrate 400 in the X-axis and Y-axis directions. As described above, since the patterning slit sheet 950 may be formed to be significantly smaller than an FMM used in a conventional deposition method, it is relatively easy to manufacture the patterning slit sheet 950 used in the present invention. In other words, using the patterning slit sheet 950, which is smaller than an FMM used in a conventional deposition method, is more convenient in all processes, including etching of the patterning slit sheet 950 and subsequent other processes, such as precise extension, welding, moving, and cleaning processes, compared to the conventional deposition method using the larger FMM. This is more advantageous for a relatively large display device.

In order to perform deposition while the thin film deposition assembly 900 or the substrate 400 is moved relative to the other as described above, the thin film deposition assembly 900 and the substrate 400 may be separate from each other by a predetermined distance. This will be described later in detail.

The deposition source 910 that contains and heats the deposition material 915 is disposed in an opposite side of the chamber to that in which the substrate 400 is disposed. As the deposition material 915 contained in the deposition source 910 is vaporized, the deposition material 915 is deposited on the substrate 400.

In particular, the deposition source 910 includes a crucible 911 that is filled with the deposition material 915, and a heater 912 that heats the crucible 911 to vaporize the deposition material 915, which is contained in the crucible 911, towards a side of the crucible 911, and in particular, towards the deposition source nozzle unit 920.

The deposition source nozzle unit 920 is disposed at a side of the deposition source 910, and in particular, at the side of the deposition source 910 facing the substrate 400. The deposition source nozzle unit 920 includes a plurality of deposition source nozzles 921 arranged at equal intervals in the Y-axis direction. The deposition material 915 that is vaporized in the deposition source 910, passes through the deposition source nozzle unit 920 towards the substrate 400 that is the deposition target. As described above, when the plurality of deposition source nozzles 921 are formed on the deposition source nozzle unit 920 in the Y-axis direction, that is, the scanning direction of the substrate 400, the size of the pattern formed by the deposition material that is discharged through each of patterning slits 951 in the patterning slit sheet 950 is only affected by the size of one deposition source nozzle 921, that is, it may be considered that one deposition nozzle 921 exists in the X-axis direction, and thus there is no shadow zone on the substrate 400. In addition, since the plurality of deposition source nozzles 921 are formed in the scanning direction of the substrate 400, even though there is a difference between fluxes of the deposition source nozzles 921, the difference may be compensated and deposition uniformity may be maintained constantly.

The patterning slit sheet 950 and a frame 955 in which the patterning slit sheet 950 is bound are disposed between the deposition source 910 and the substrate 400. The frame 955 may be formed in a lattice shape, similar to a window frame. The patterning slit sheet 950 is bound inside the frame 955. The patterning slit sheet 950 includes a plurality of patterning slits 951 arranged in the X-axis direction. The deposition material 915 that is vaporized in the deposition source 910, passes through the deposition source nozzle unit 920 and the patterning slit sheet 950 toward the substrate 400. The patterning slit sheet 950 may be manufactured by etching, which is the same method as used in a conventional method of manufacturing an FMM, and in particular, a striped FMM. Here, the total number of patterning slits 951 may be greater than the total number of deposition source nozzles 921.

On the other hand, the deposition source 910 (and the deposition source nozzle unit 920 coupled to the deposition source 910) and the patterning slit sheet 950 may be formed to be separate from each other by a predetermined distance. Alternatively, the deposition source 910 (and the deposition source nozzle unit 920 coupled to the deposition source 910) and the patterning slit sheet 950 may be connected by connection members 935. That is, the deposition source 910, the deposition source nozzle unit 920, and the patterning slit sheet 950 may be formed integrally with each other by being connected to each other via the connection members 935. The connection member 935 guides the deposition material 915, which is discharged through the deposition source nozzles 921, to move straight, not to flow in the X-axis direction. In FIGS. 9 through 11, the connection members 935 are formed on left and right sides of the deposition source 910, the deposition source nozzle unit 920, and the patterning slit sheet 950 to guide the deposition material 915 not to flow in the X-axis direction, however, the present invention is not limited thereto. That is, the connection member 935 may be formed as a sealed type of a box shape to guide flow of the deposition material 915 in the X-axis and Y-axis directions.

As described above, the thin film deposition apparatus 900 according to the current embodiment of the present invention performs deposition while being moved relative to the substrate 400. In order to move the thin film deposition apparatus 900 relative to the substrate 400, the patterning slit sheet 950 is separate from the substrate 400 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask. In order to overcome this problem, in the thin film deposition apparatus 900 according to the current embodiment of the present invention, the patterning slit sheet 950 is disposed to be separate from the substrate 400 by a predetermined distance.

As described above, according to the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

In the thin film deposition assembly 900 according to the current embodiment of the present invention, each of the patterning slits 951 includes a plurality of sub-slits 951*a* and 951*b*. As described above, one patterning slit 951 includes the plurality of sub-slits 951*a* and 951*b*, and the sub-slits 951*a* and 951*b* are arranged so that patterns formed by the plurality of sub-slits 951*a* and 951*b* overlap each other. Then, a desired pattern may be obtained. Since this is described in detail in the previous embodiment, and thus, detailed descriptions are not provided here.

Figure 12:
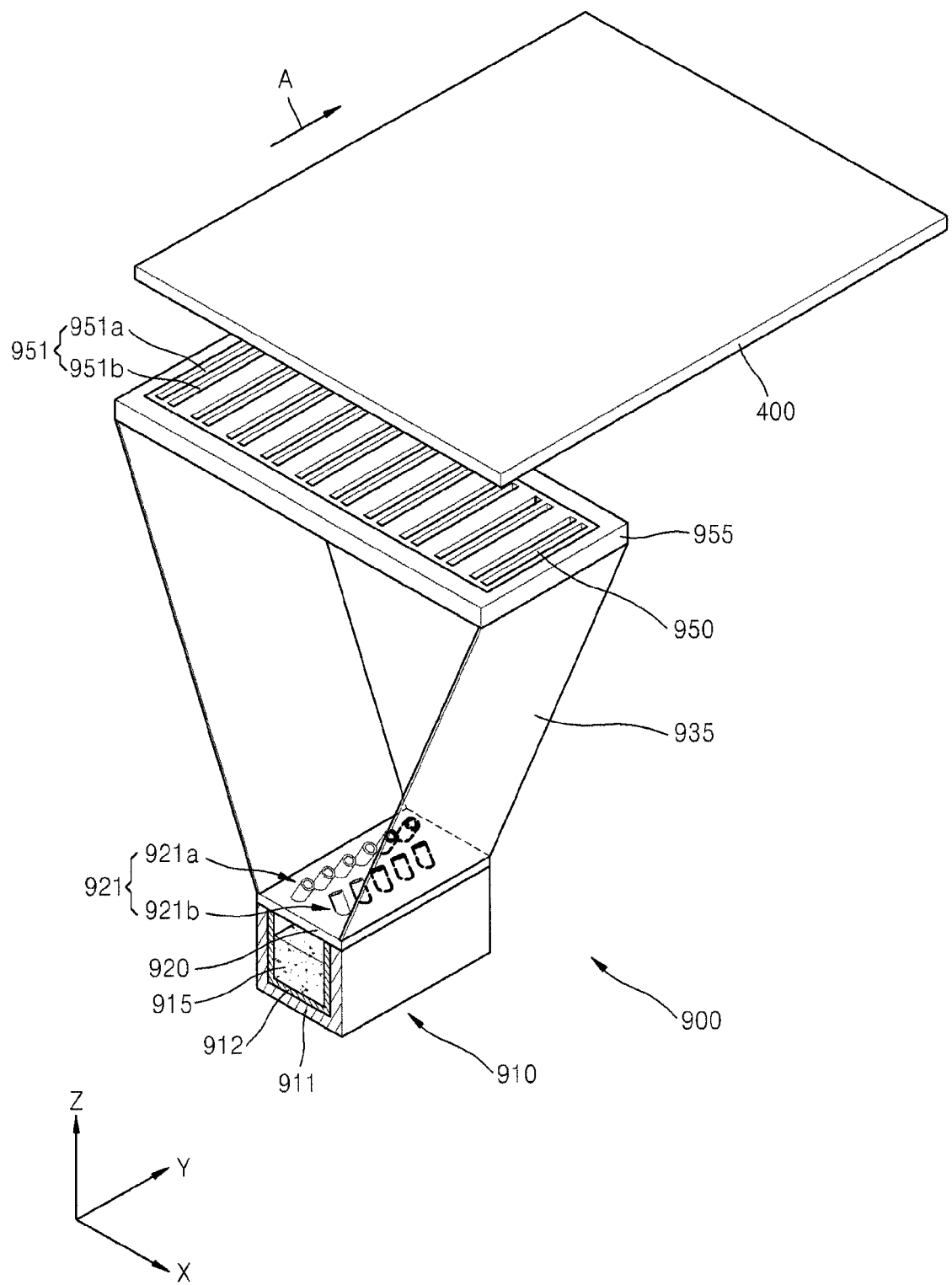
FIG. 12 is a schematic perspective view of the thin film deposition apparatus according to another embodiment of the present invention.

FIG. 12 is a schematic perspective view of the thin film deposition apparatus 900 according to another embodiment of the present invention. Referring to FIG. 12, the thin film deposition apparatus 900 according to the current embodiment of the present invention includes a deposition source 910, a deposition source nozzle unit 920, and a patterning slit sheet 950. In particular, the deposition source 910 includes a crucible 911 that is filled with the deposition material 915, and a heater 912 that heats the crucible 911 to vaporize the deposition material 915, which is contained in the crucible 912, towards a side of the crucible 911, and in particular, towards the deposition source nozzle unit 920. The deposition source nozzle unit 920, which has a planar shape, is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and the substrate 400, and the patterning slit sheet 950 includes a plurality of patterning slits 951 arranged in the X-axis direction. In addition, the deposition source 910, the deposition source nozzle unit 920, and the patterning slit sheet 950 are connected to each other by the connection member 935.

In the current embodiment of the present invention, the plurality of deposition source nozzles 920 formed on the deposition source nozzle unit 921 are tilted at a predetermined angle. In particular, the deposition source nozzles 921 may include deposition source nozzles 921*a* and 921*b* which are arranged in two rows, which are alternately arranged with each other. Here, the deposition source nozzles 921*a* and 921*b* may be tilted at a predetermined angle on an X-Z plane.

That is, in the current embodiment of the present invention, the deposition source nozzles 921*a* and 921*b* are arranged in tilted states at a predetermined angle. Here, the deposition source nozzles 921*a* in a first row may be tilted toward the deposition nozzles 921*b* in a second row, and the deposition source nozzles 921*b* in the second row may be tilted toward the deposition source nozzles 921*a* in the first row. That is, the deposition source nozzles 921*a* arranged in the row at the left side of the patterning slit sheet 950 are arranged to face the right side of the patterning slit sheet 950, and the deposition source nozzles 921*b* arranged in the row at the right side of the patterning slit sheet 950 are arranged to face the left side of the patterning slit sheet 950.

Figure 13:
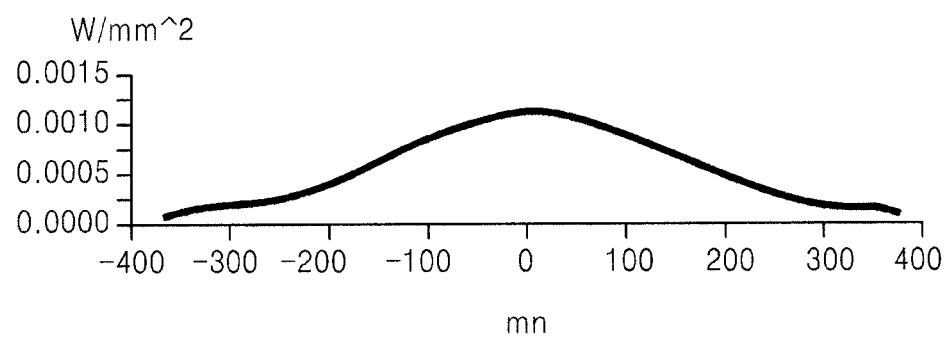
FIG. 13 is a graph schematically illustrating a thickness distribution of a layer formed on a substrate when a deposition source nozzle was not tilted, in a thin film deposition apparatus according to another embodiment of the present invention.
Figure 14:
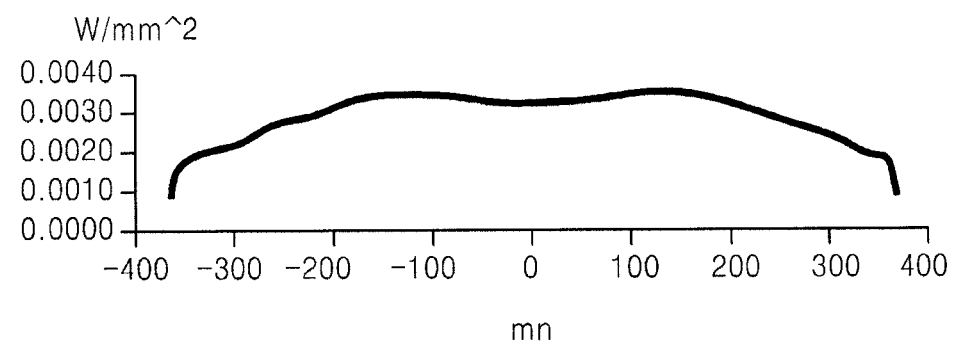
FIG. 14 is a graph schematically illustrating a thickness distribution of a layer formed on a substrate when a deposition source nozzle was tilted, in a thin film deposition apparatus according to the embodiment of FIG. 13.

FIG. 13 is a graph illustrating a thickness distribution of a deposition layer formed on the substrate 400 when the deposition source nozzles 921 were not tilted, in the thin film deposition apparatus 900 according to the current embodiment of the present invention, and FIG. 14 is a graph showing a thickness distribution of a deposition layer formed on the substrate 400 when the deposition source nozzles 921 were tilted, in the thin film deposition apparatus 900 according to this embodiment of the present invention. Comparing the graphs of FIGS. 13 and 14 with each other, the thickness of both sides of the deposition layer formed on the substrate 400 when the deposition source nozzles 921 are tilted is relatively greater than that of both sides of the deposition layer formed on the substrate 400 when the deposition source nozzles 921 are not tilted, and thus, the uniformity of the thin film is improved when the deposition source nozzles 921*a* and 921*b* are tilted.

Therefore, the deposition amount of the deposition material may be adjusted so that the difference between the thickness of the center portion in the thin film and thickness of the both sides of the thin film formed on the substrate may be reduced and the entire thickness of the thin film may be constant, and moreover, the efficiency of utilizing the deposition material may be improved.

As described above, the thin film deposition apparatus according to aspects of the present invention may be easily manufactured and may be simply applied to produce large-sized display devices on a mass scale. The thin film deposition apparatus may improve manufacturing yield and deposition efficiency and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a thin film on a substrate, the method comprising:
    disposing the substrate to be separated from a thin film deposition apparatus by a set distance; and
    discharging a deposition material via a deposition source of the thin film deposition apparatus onto the substrate during a relative motion between the thin film deposition apparatus and the substrate to the thin film;
    wherein a deposition source nozzle unit of the thin film deposition apparatus is disposed at a side of the deposition source and includes a plurality of deposition source nozzles arranged in a first direction,
    wherein a patterning slit sheet of the thin film deposition apparatus is disposed to be between the deposition source nozzle unit and the substrate, the patterning slit sheet including a plurality of patterning slits,
    wherein each of the patterning slits includes a plurality of sub-slits,
    wherein a first patterning slit of the patterning slits is spaced apart from a second patterning slit of the patterning slits,
    wherein a third patterning slit of the patterning slits is spaced apart from the first and the second patterning slits of the patterning slits, wherein sub-slits of the first patterning slit are spaced apart from each other,
wherein sub-slits of the second patterning slit are spaced apart from each other,
wherein sub-slits of the third patterning slit are spaced apart from each other,
wherein the space between the first patterning slit and the second patterning slit is greater than both the space between the sub-slits of the first patterning slit and the space between the sub-slits of the second patterning slit, and
wherein the sub-slits of the first patterning slit are parallel to the sub-slits of the second and the third patterning slits.

2. The method of claim 1, wherein a gap between the neighboring patterning slits is greater than a gap between the neighboring sub-slits included in one patterning slit.

3. The method of claim 1, further comprising arranging the plurality of sub-slits so that at least a part of a pattern that is formed of the deposition material discharged from one of the sub-slits included in one patterning slit of the patterning slits towards the substrate and at least a part of a pattern that is formed of the deposition material discharged from another one of the sub-slits included in the one patterning slit towards the substrate overlaps each other.

4. The method of claim 1, further comprising
arranging the plurality of sub-slits to be parallel with each other,
wherein the plurality of sub-slits are rectangles.

5. The method of claim 1, further comprising
arranging the plurality of sub-slits in a plurality of rows which are in parallel with each other,
wherein the plurality of sub-slits are holes.

6. The method of claim 5, further comprising
continuously depositing the deposition material contained in the deposition source of the thin film deposition apparatus on the substrate and
moving the substrate or the thin film deposition apparatus relative to the other.

7. The method of claim 5, wherein the thin film deposition apparatus or the substrate is movable relative to the other along a plane parallel to a surface of the substrate on which the deposition materials are deposited.

8. The method of claim 1, wherein the patterning slit sheet of the thin film deposition apparatus is smaller than the substrate.

9. The method of claim 1, wherein the total number of the patterning slits is greater than a total number of the deposition source nozzles.

10. The method of claim 1, wherein the patterning slits are arranged in a second direction perpendicular to the first direction.

11. The method of claim 10, wherein the deposition source and the deposition source nozzle unit, and the patterning slit sheet are connected to the other by a connection member.

12. The method of claim 11, wherein the connection member guides movement of the discharged deposition material.

13. The method of claim 11, wherein the connection member seals the space between the deposition source and the deposition source nozzle unit, and the patterning slit sheet.

14. The method of claim 10, wherein the plurality of deposition source nozzles are tilted at a predetermined angle.

15. The method of claim 14, wherein the plurality of deposition source nozzles includes deposition source nozzles arranged in two rows formed in the first direction, and the deposition source nozzles in the two rows are tilted to face each other.

16. The method of claim 14, wherein the plurality of deposition source nozzles include deposition source nozzles arranged in two rows formed in the first direction, the deposition source nozzles arranged in the row located at a first side of the patterning slit sheet are arranged to face a second side of the patterning slit sheet, and the deposition source nozzles arranged in the other row located at the second side of the patterning slit sheet are arranged to face the first side of the patterning slit sheet.

* * * * *